US010644039B2

(12) United States Patent
Okazaki et al.

(10) Patent No.: US 10,644,039 B2
(45) Date of Patent: May 5, 2020

(54) WIRING LAYER AND MANUFACTURING METHOD THEREFOR

(71) Applicant: Semiconductor Energy Laboratory Co., Ltd., Kanagawa-ken (JP)

(72) Inventors: Yutaka Okazaki, Kanagawa (JP); Tomoaki Moriwaka, Kanagawa (JP); Shinya Sasagawa, Kanagawa (JP); Takashi Ohtsuki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 16/423,884

(22) Filed: May 28, 2019

(65) Prior Publication Data

US 2019/0355751 A1 Nov. 21, 2019

Related U.S. Application Data

(63) Continuation of application No. 15/708,714, filed on Sep. 19, 2017, now Pat. No. 10,304,864, which is a
(Continued)

(30) Foreign Application Priority Data

Oct. 1, 2014 (JP) .................................. 2014-202820

(51) Int. Cl.
*H01L 29/66* (2006.01)
*H01L 27/12* (2006.01)
(Continued)

(52) U.S. Cl.
CPC ...... *H01L 27/124* (2013.01); *H01L 21/76849* (2013.01); *H01L 27/1255* (2013.01);
(Continued)

(58) Field of Classification Search
CPC ......... H01L 29/66742; H01L 29/66969; H01L 29/78603; H01L 29/78654; H01L 29/7869
See application file for complete search history.

(56) References Cited

U.S. PATENT DOCUMENTS 5,112,765 A 5/1992 Cederbaum et al.
5,528,032 A 6/1996 Uchiyama
(Continued)

FOREIGN PATENT DOCUMENTS

EP 0469215 A1 2/1992
EP 1 302 981 A2 4/2003
(Continued)

OTHER PUBLICATIONS

Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
(Continued)

Primary Examiner — Douglas M Menz
(74) Attorney, Agent, or Firm — Husch Blackwell LLP

(57) ABSTRACT

To provide a miniaturized semiconductor device with low power consumption. A method for manufacturing a wiring layer includes the following steps: forming a second insulator over a first insulator; forming a third insulator over the second insulator; forming an opening in the third insulator so that it reaches the second insulator; forming a first conductor over the third insulator and in the opening; forming a second conductor over the first conductor; and after forming the second conductor, performing polishing treatment to remove portions of the first and second conductors above a top surface of the third insulator. An end of the first conductor is at a level lower than or equal to the top level of the opening. The top surface of the second conductor
(Continued)

is at a level lower than or equal to that of the end of the first conductor.

19 Claims, 26 Drawing Sheets

Related U.S. Application Data continuation of application No. 14/870,912, filed on Sep. 30, 2015, now Pat. No. 9,773,820.

(51) Int. Cl.
| | | |
|---|---|---|
| *H01L 29/786* | (2006.01) | |
| *H01L 21/768* | (2006.01) | |
| *H01L 23/532* | (2006.01) | |

(52) U.S. Cl.
CPC .. *H01L 29/66742* (2013.01); *H01L 29/66969* (2013.01); *H01L 29/7869* (2013.01); *H01L 29/78603* (2013.01); *H01L 29/78609* (2013.01); *H01L 29/78648* (2013.01); *H01L 29/78654* (2013.01); *H01L 23/53223* (2013.01); *H01L 23/53238* (2013.01); *H01L 23/53266* (2013.01)

(56) References Cited

U.S. PATENT DOCUMENTS

| | | |
|---|---|---|
| 5,744,864 A | 4/1998 | Cillessen et al. |
| 6,028,362 A | 2/2000 | Omura |
| 6,051,496 A | 4/2000 | Jang |
| 6,191,027 B1 | 2/2001 | Omura |
| 6,277,730 B1 | 8/2001 | Yuasa et al. |
| 6,365,959 B2 | 4/2002 | Yuasa et al. |
| 6,376,376 B1 | 4/2002 | Lim et al. |
| 6,403,468 B1 | 6/2002 | Sugai |
| 6,492,260 B1 | 12/2002 | Kim et al. |
| 6,579,785 B2 | 6/2003 | Toyoda et al. |
| 7,524,752 B2 | 4/2009 | Tsutsue |
| 7,989,334 B2 | 8/2011 | Tsutsue |
| 8,378,341 B2 | 2/2013 | Hayashi et al. |
| 8,547,771 B2 | 10/2013 | Koyama |
| 8,576,620 B2 | 11/2013 | Yamazaki et al. |
| 8,901,553 B2 | 12/2014 | Inoue et al. |
| 9,117,916 B2 | 8/2015 | Hatano et al. |
| 9,129,937 B2 | 9/2015 | Hayashi et al. |
| 9,312,394 B2 | 4/2016 | Hayashi et al. |
| 9,349,844 B2 | 5/2016 | Inoue et al. |
| 9,754,816 B2 | 9/2017 | Hayashi et al. |
| 9,922,685 B2 | 3/2018 | Yamazaki et al. |
| 2003/0068582 A1 | 4/2003 | Komada et al. |
| 2003/0214010 A1 | 11/2003 | Toyoda et al. |
| 2011/0049460 A1 | 3/2011 | Breitwisch et al. |
| 2015/0187898 A1 | 7/2015 | Miyairi |
| 2015/0270402 A1 | 9/2015 | Endo et al. |
| 2016/0035865 A1 | 2/2016 | Nagamatsu et al. |
| 2016/0240625 A1 | 8/2016 | Inoue et al. |

FOREIGN PATENT DOCUMENTS

| | | |
|---|---|---|
| JP | 06-013576 A | 1/1994 |
| JP | 06-275697 A | 9/1994 |
| JP | 10-313009 A | 11/1998 |
| JP | 11-505377 | 5/1999 |
| JP | 11-317454 A | 11/1999 |
| JP | 2000-068272 A | 3/2000 |
| JP | 2001-210644 A | 8/2001 |
| JP | 2003-124189 A | 4/2003 |
| JP | 2010-141230 A | 6/2010 |
| JP | 2011-123986 A | 6/2011 |
| JP | 2012-248582 A | 12/2012 |
| JP | 2012-257187 A | 12/2012 |
| JP | 2013-247143 A | 12/2013 |
| WO | WO 2011/058934 A1 | 5/2011 |

OTHER PUBLICATIONS

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Yamazaki, S. et al., "Back-Channel-Etched Thin-Film Transistor Using c-Axis-Aligned Crystal In—Ga—Zn Oxide," Journal of the Society for Information Display, 2014, vol. 22, No. 1, pp. 55-67.

Yamazaki, S. et al., "In—Ga—Zn—Oxide Semiconductor and Its Transistor Characteristics," ECS Journal of Solid State Science and Technology, Jul. 1, 2014, vol. 3, No. 9, pp. Q3012-Q3022.

Kaanta, C.W. et al., "Dual Damascene: A ULSI Wiring Technology," VMIC Conference (Proceedings. International IEEE VLSI Multilevel Interconnection Conference, 1991), Jun. 11, 1991, pp. 144-152.

2 nm 2 nm 2 nm

FIG. 8A
FIG. 8B
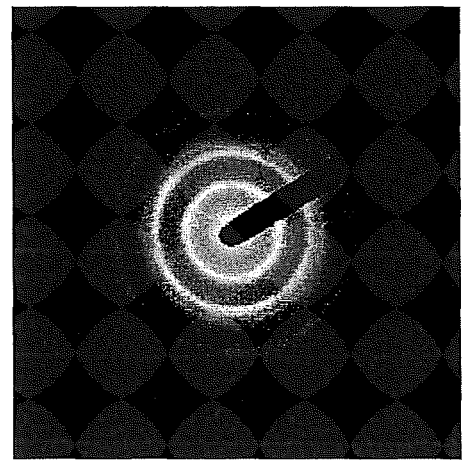

FIG. 17A1
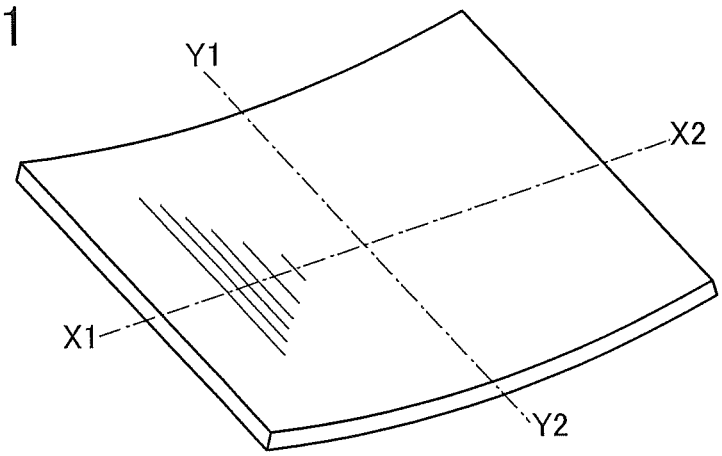
FIG. 17A2
FIG. 17A3
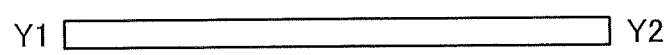
FIG. 17B1
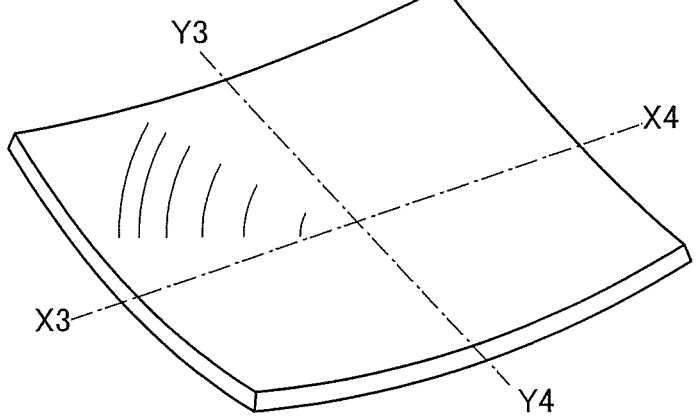
FIG. 17B2
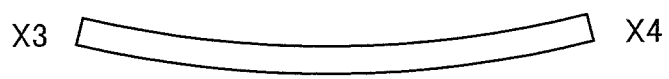
FIG. 17B3
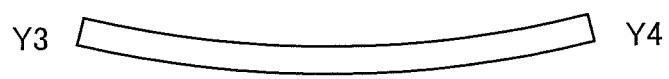

WIRING LAYER AND MANUFACTURING METHOD THEREFOR

This application is a continuation of copending U.S. application Ser. No. 15/708,714, filed on Sep. 19, 2017 which is a continuation of U.S. application Ser. No. 14/870,912, filed on Sep. 30, 2015 (now U.S. Pat. No. 9,773,820 issued Sep. 26, 2017) which are all incorporated herein by reference.

BACKGROUND OF THE INVENTION

1. Field of the Invention

The present invention relates to an object, a method, or a manufacturing method. The present invention relates to a process, a machine, manufacture, or a composition of matter. One embodiment of the present invention relates to a semiconductor device, a display device, a light-emitting device, a power storage device, an imaging device, a storage device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

As silicon which is used as a semiconductor of a transistor, either amorphous silicon or polycrystalline silicon is used depending on the purpose. For example, for a transistor included in a large display device, it is preferable to use amorphous silicon, which can be used to form a film on a large substrate with the established technique. For a transistor included in a high-performance display device where a driver circuit and a pixel portion are formed over the same substrate, it is preferable to use polycrystalline silicon, which can be used to form a transistor having a high field-effect mobility. As a method for forming polycrystalline silicon, high-temperature heat treatment or laser light treatment which is performed on amorphous silicon has been known.

In recent years, transistors including oxide semiconductors (typically, an In—Ga—Zn oxide) have been actively developed. The transistors including oxide semiconductors have features different from those of the transistors including amorphous silicon or polycrystalline silicon. For example, a display device for which a transistor including an oxide semiconductor is used is known to have low power consumption.

It is known that a transistor including an oxide semiconductor has an extremely low leakage current in an off state. For example, a low-power-consumption CPU utilizing a characteristic of low leakage current of the transistor including an oxide semiconductor has been disclosed (see Patent Document 1).

For reduction of power consumption by power gating, the transistor including an oxide semiconductor preferably has normally-off electrical characteristics. As a method for making the transistor including an oxide semiconductor have normally-off electrical characteristics by controlling the threshold voltage of the transistor, Patent Document 2 has disclosed a method in which a floating gate is provided in a region overlapping with the oxide semiconductor and negative fixed charge is injected into the floating gate.

An oxide semiconductor can be deposited by a sputtering method or the like, and thus can be used in a transistor included in a large display device. Because a transistor including an oxide semiconductor has high field-effect mobility, a high-performance display device in which a driver circuit and a pixel portion are formed over the same substrate can be obtained. In addition, there is an advantage that capital investment can be reduced because part of production equipment for a transistor including amorphous silicon or a transistor including polycrystalline silicon can be retrofitted and utilized.

Oxide semiconductors have a long history, and in 1985, synthesis of an In—Ga—Zn oxide crystal was reported (see Non-Patent Document 1). Furthermore, in 1995, it was reported that an In—Ga—Zn oxide has a homologous structure and is represented by a composition formula $InGaO_3(ZnO)_m$ (m is a natural number) (see Non-Patent Document 2).

In 1995, a transistor including an oxide semiconductor was invented, and its electrical characteristics were disclosed (see Patent Document 3).

In 2014, transistors including a crystalline oxide semiconductor were reported (see Non-Patent Documents 3 and 4). The transistors in these reports include a c-axis aligned crystalline oxide semiconductor (CAAC-OS) and thus are capable of mass-production and have excellent electrical characteristics and high reliability.

With miniaturization of an integrated circuit, reduction in the resistance of a wiring layer and increase in the number of layers of the wiring layer have proceeded, and it is necessary to planarize the wiring layer. To achieve these, a damascene method in which a wiring layer is embedded in an interlayer insulating film has been widely used (see Non-patent Document 5).

REFERENCE

Patent Document

[Patent Document 1] Japanese Published Patent Application No. 2012-257187
[Patent Document 2] Japanese Published Patent Application No. 2013-247143
[Patent Document 3] Japanese Published Patent Application No. H11-505377

Non-Patent Document

[Non-Patent Document 1] N. Kimizuka and T. Mohri, *Journal of Solid State Chemistry*, Vol. 60, 1985, pp. 382-384
[Non-Patent Document 2] N. Kimizuka, M. Isobe and M. Nakamura, *Journal of Solid State Chemistry*, Vol. 116, 1995, pp. 170-178
[Non-Patent Document 3] S. Yamazaki, T. Hirohashi, M. Takahashi, S. Adachi, M. Tsubuku, J. Koezuka, K. Okazaki, Y. Kanzaki, H. Matsukizono, S. Kaneko, S. Mori, and T. Matsuo, *Journal of the Society for Information Display*, Vol. 22, Issue 1, 2014, pp. 55-67
[Non-Patent Document 4] S. Yamazaki, T. Atsumi, K. Dairiki, K. Okazaki, and N. Kimizuka, *ECS Journal of Solid State Science and Technology*, Vol. 3, Issue 9, 2014, pp. Q3012-Q3022
[Non-Patent Document 5] C. W. Kaanta, S. G. Bombardier, W. J. Cote, W. R. Hill, G. Kerszykowski, H. S. Landis, D. J. Poinchexter, C. W. Pollard, G. H. Ross, J. G. Ryan, S.

Wolff, and J. E. Cronin, *Dual Damascene: A ULSI Wiring Technology*, VMIC Conference, 1991, pp. 144-152

SUMMARY OF THE INVENTION

An object of one embodiment of the present invention is to provide a miniaturized semiconductor device. Another object of one embodiment of the present invention is to provide a semiconductor device with low power consumption. Another object of one embodiment of the present invention is to provide a highly reliable semiconductor device. Another object of one embodiment of the present invention is to provide a semiconductor device with a low off-state current. Another object of one embodiment of the present invention is to provide a semiconductor device capable of retaining data for a long period. Another object of one embodiment of the present invention is to provide a novel semiconductor device. Another object of one embodiment of the present invention is to provide an eye-friendly display device. Another object of one embodiment of the present invention is to provide a semiconductor device including a transparent semiconductor.

Note that the description of these objects does not disturb the existence of other objects. In one embodiment of the present invention, there is no need to achieve all the objects. Other objects will be apparent from and can be derived from the description of the specification, the drawings, the claims, and the like.

(1) One embodiment of the present invention is a method for manufacturing a wiring layer. The method includes the following steps: forming a second insulator over a first insulator; forming a third insulator over the second insulator; forming an opening in the third insulator so that it reaches the second insulator; forming a first conductor over the third insulator and in the opening; forming a second conductor over the first conductor; and after forming the second conductor, performing polishing treatment to remove portions of the first and second conductors above a top surface of the third insulator. An end of the first conductor is at a level lower than or equal to the top level of the opening. The top surface of the second conductor is at a level lower than or equal to that of the end of the first conductor.

(2) One embodiment of the present invention is a method for manufacturing a wiring layer. The method includes the following steps: forming a second insulator over a first insulator; forming a third insulator over the second insulator; forming an opening in the third insulator so that it reaches the second insulator; forming a first conductor over the third insulator and in the opening; forming a second conductor over the first conductor; after forming the second conductor, performing polishing treatment to remove portions of the first and second conductors above a top surface of the third insulator; forming a third conductor over the second conductor and the third insulator; and performing polishing treatment on the third conductor until the third insulator is reached. An end of the first conductor is at a level lower than or equal to the top level of the opening. The top surface of the second conductor is at a level lower than or equal to that of the end of the first conductor. The third conductor is in contact with the top surface of the second conductor, and is in contact with the end of the first conductor at the end of the opening.

(3) One embodiment of the present invention is a wiring layer including a first insulator; a second insulator over the first insulator; a third insulator over the second insulator; an opening formed in the third insulator so as to reach the second insulator; a first conductor in contact with side surfaces and the bottom surface of the opening; and a second conductor over the first conductor and in the opening. An end of the first conductor at an end of the opening is at a level lower than or equal to the top level of the opening. The top surface of the second conductor is at a level lower than or equal to that of the end of the first conductor.

(4) One embodiment of the present invention is a wiring layer including a first insulator; a second insulator over the first insulator; a third insulator over the second insulator; an opening formed in the third insulator so as to reach the second insulator; a first conductor in contact with side surfaces and the bottom surface of the opening; a second conductor over the first conductor and in the opening; and a third conductor over the second conductor and in the opening. An end of the first conductor at an end of the opening is at a level lower than or equal to the top level of the opening. The top surface of the second conductor is at a level lower than or equal to that of the end of the first conductor. The third conductor is in contact with the top surface of the second conductor, and is in contact with the end of the first conductor at the end of the opening.

(5) One embodiment of the present invention is the wiring layer described in (3) in which the first conductor allows less oxygen to pass therethrough than the second conductor.

(6) One embodiment of the present invention is the wiring layer described in (4) in which the first conductor and the third conductor allow less oxygen to pass therethrough than the second conductor.

A miniaturized semiconductor device can be provided. Alternatively, a semiconductor device with low power consumption can be provided. Alternatively, a highly reliable semiconductor device can be provided. Alternatively, a semiconductor device with a low off-state current can be provided. Alternatively, a semiconductor device capable of retaining data for a long period can be provided. Alternatively, a novel semiconductor device can be provided. Alternatively, an eye-friendly display device can be provided. Alternatively, a semiconductor device including a transparent semiconductor can be provided.

Note that the description of these effects does not disturb the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

In the accompanying drawings:

FIGS. 8A and 8B show electron diffraction patterns of a CAAC-OS;

FIGS. 17A1, 17A2, 17A3, 17B1, 17B2, and 17B3 are perspective views and cross-sectional views of semiconductor devices of embodiments of the present invention;

DETAILED DESCRIPTION OF THE INVENTION

Figure 1A:
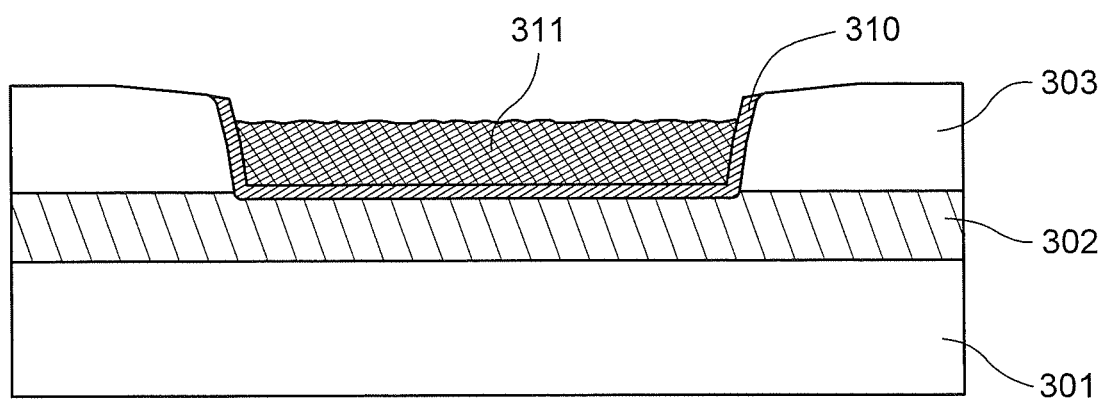
FIGS. 1A and 1B each show a cross-sectional view of a wiring layer of one embodiment of the present invention.

Hereinafter, embodiments and examples will be described with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be interpreted as being limited to the content of the embodiments and examples below.

Note that in structures of the present invention described below, the same portions or portions having similar functions are denoted by the same reference numerals in different drawings, and description thereof is not repeated in some cases. Furthermore, the same hatching pattern is applied to portions having similar functions, and the portions are not particularly denoted by reference numerals in some cases.

Note that functions of a "source" and a "drain" of a transistor are sometimes replaced with each other when a transistor of opposite polarity is used or when the direction of current flow is changed in circuit operation, for example. Therefore, the terms "source" and "drain" can be used to denote the drain and the source, respectively, in this specification.

Note that in this specification and the like, ordinal numbers such as "first" and "second" are used in order to avoid confusion among components and do not limit the components numerically.

Note that in each drawing described in this specification, the size, the layer thickness, or the region of each component is exaggerated for clarity in some cases. Therefore, the scale is not necessarily limited to that illustrated in the drawings.

A transistor is a kind of semiconductor elements and can achieve amplification of a current or a voltage, switching operation for controlling conduction or non-conduction, or the like. Examples of transistors in this specification include an insulated-gate field effect transistor (IGFET) and a thin film transistor (TFT).

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Unless otherwise specified, an off-state current in this specification refers to a drain current of a transistor in the off state (also referred to as a non-conduction state and a cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on the voltage Vgs in some cases. Thus, "the off-state current of a transistor is lower than or equal to I" may mean "there is a voltage Vgs with which the off-state current of the transistor becomes lower than or equal to I". Furthermore, "the off-state current of a transistor" means "the off-state current in an off state at a predetermined voltage Vgs", "the off-state current in an off state at a voltage Vgs in a predetermined range", "the off-state current in an off state at a voltage Vgs with which sufficiently reduced off-state current is obtained", or the like.

As an example, the assumption is made of an n-channel transistor where the threshold voltage Vth is 0.5 V and the drain current is $1 \times 10^{-9}$ A at a voltage Vgs of 0.5 V, $1 \times 10^{-13}$ A at a voltage Vgs of 0.1 V, $1 \times 10^{-19}$ A at a voltage Vgs of −0.5 V, and $1 \times 10^{-22}$ A at a voltage Vgs of −0.8 V. The drain current of the transistor is $1 \times 10^{-19}$ A or lower at a voltage Vgs of −0.5 V or at a voltage Vgs in the range of −0.8 V to −0.5 V; therefore, it may be said that the off-state current of the transistor is $1 \times 10^{-19}$ A or lower. Since there is Vgs at which the drain current of the transistor is $1 \times 10^{-22}$ A or lower, it may be said that the off-state current of the transistor is $1 \times 10^{-22}$ A or lower.

In this specification, the off-state current of a transistor with a channel width W is sometimes represented by a current value in relation to the channel width W or by a current value per given channel width (e.g., 1 μm). In the latter case, the off-state current may be represented with a unit meaning current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like including the transistor is used (e.g., temperature in the range of 5° C. to 35° C.). The case where the off-state current of the transistor is lower than or equal to I may indicate the existence of a value of Vgs at which the off-state current of the transistor is lower than or equal to I at room temperature, 60° C., 85° C., 95° C., or 125° C., at a temperature where the reliability of a semiconductor device or the like including the transistor is ensured, or at a temperature where the semiconductor device or the like including the transistor is used (e.g., temperature in the range of 5° C. to 35° C.).

The off-state current of a transistor depends on the voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the reliability of a semiconductor device or the like including the transistor is ensured or Vds used in the semiconductor device or the like including the transistor. The case where the off-state current of the transistor is lower than or equal to I may indicate the existence of Vgs at which the off-state current of the transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, Vds where the reliability of a semiconductor device or the like including the transistor is ensured or Vds used in the semiconductor device or the like including the transistor.

In this specification, the term "leakage current" sometimes expresses the same meaning as an off-state current.

In this specification, the off-state current sometimes refers to a current that flows between a source and a drain when a transistor is off, for example.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

(Embodiment 1)

In this embodiment, a method for manufacturing a wiring layer will be described with reference to FIGS. 2A to 2C.

Figure 2A:
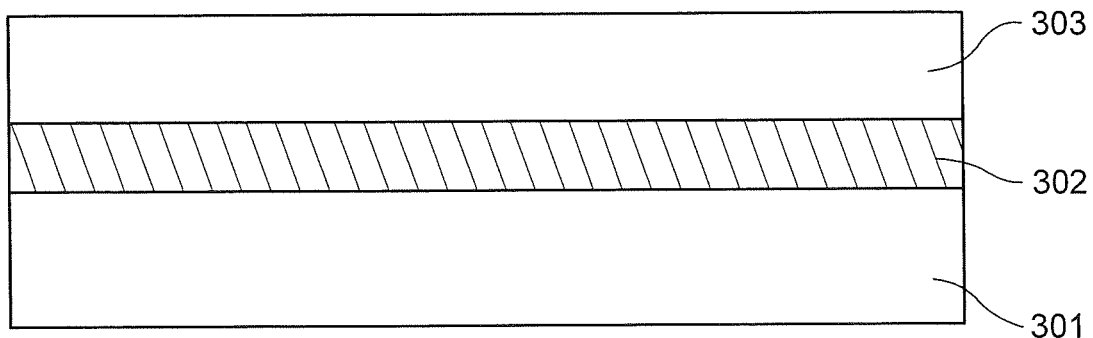
FIGS. 2A to 2C illustrate a manufacturing method for a wiring layer of one embodiment of the present invention.
Figure 2B:
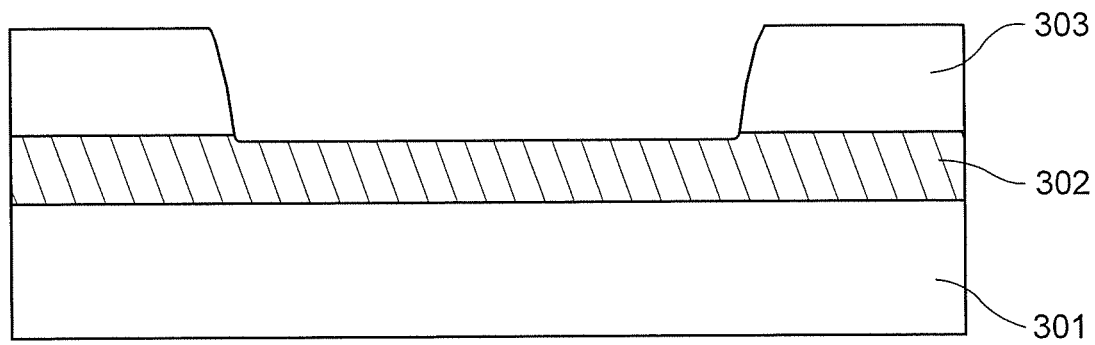
Figure 2C:
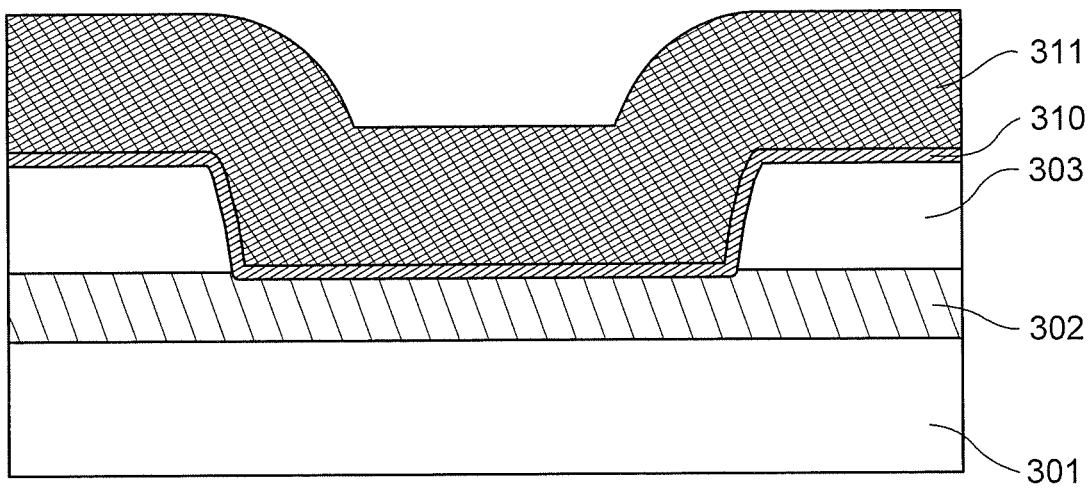

First, an insulator 302 is formed over an insulator 301, and an insulator 303 is formed over the insulator 302 (see FIG. 2A). Then, a groove is formed in the insulator 303 so as to reach the insulator 302. Examples of the groove include a hole and an opening (see FIG. 2B). In forming the groove, wet etching may be employed; however, dry etching is preferably employed in Willis of microfabrication. The insulator 302 is preferably an insulator that serves as an etching stopper film used in forming the groove by etching the insulator 303. For example, in the case where a silicon oxide film is used as the insulator 303 in which the groove is to be formed, the insulator 302 is preferably formed using a silicon nitride film or an aluminum oxide film.

Although the insulator 302 is used in this embodiment, depending on the intended use, a conductor or semiconductor may be used instead of the insulator 302.

After the formation of the groove, a conductor 310 is formed. The conductor 310 preferably hardly allows oxygen to pass therethrough. Alternatively, the conductor 310 preferably allows less oxygen to pass therethrough than a conductor 311. For example, tantalum nitride, tungsten nitride, or titanium nitride can be used. The conductor 310 can be formed by a sputtering method, a CVD method, an ALD method, or the like. Then, the conductor 311 is formed over the conductor 310 (see FIG. 2C). The conductor 311 preferably has low resistance. For example, tantalum, tungsten, titanium, molybdenum, aluminum, copper, or a molybdenum-tungsten alloy can be used. The conductor 311 can be formed by a method similar to that for the conductor 310.

Next, chemical mechanical polishing (CMP) is performed to remove portions of the conductors 310 and 311 that are located over the insulator 303. Consequently, the conductors 310 and 311 remain only in the groove, whereby a wiring layer illustrated in FIG. 1A can be formed.

An end of the conductor 310 at an end of the groove is at a level lower than or equal to that of the open side of the groove. The top surface of the conductor 311 is at a level lower than or equal to that of the end of the conductor 310. These are due to a difference in polishing rate between the conductors 310 and 311. That is, in this embodiment, the polishing rate for the conductor 311 is higher than that for the conductor 310.

When a conductor is used as a wiring layer or an electrode layer, it is necessary to prevent oxidation of the conductor due to oxygen contained in an oxide film in the vicinity of the conductor, such as a silicon oxide film. Oxidation of the conductor might increase the resistance, degrading the function of the wiring layer or the electrode layer. Moreover, oxidation of the conductor might increase its volume and thus cause separation or cracking of the conductor itself or a film in the vicinity of the conductor. Therefore, it is important to prevent the oxidation.

According to one embodiment of the present invention, the bottom surface and side surfaces of the conductor 311 are surrounded by the conductor 310 and thus the conductor 311 is not in direct contact with the oxide film as illustrated in FIG. 1A. This can suppress entry of oxygen into the conductor 311, so that a significant problem can be prevented; for example, the conductor 311 can be prevented from separated because of increase in the volume caused by oxidation of the conductor 311.

Although a substrate is not illustrated in this embodiment, a single material semiconductor substrate of silicon, germanium, or the like or a compound semiconductor substrate of silicon carbide, silicon germanium, gallium arsenide, indium phosphide, zinc oxide, gallium oxide, or the like can be used, for example. Alternatively, an insulator substrate made of quartz, glass, or the like may be used and the wiring layer formed in this embodiment can be provided above the insulator substrate. Alternatively, any of the above substrates provided with elements such as a transistor and a capacitor may be used.

At least part of this embodiment can be implemented in combination with any of the other embodiments described in this specification as appropriate.

(Embodiment 2)

Figure 1B:
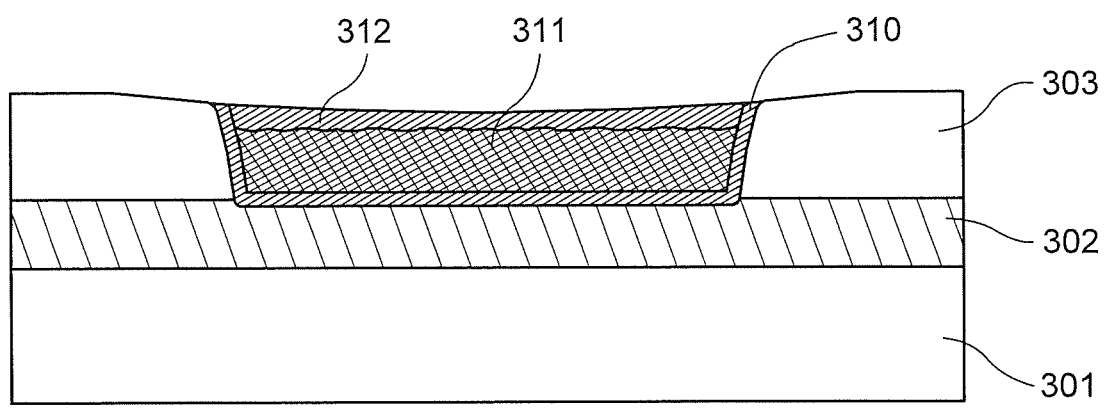

In this embodiment, a method for manufacturing such a wiring layer as is illustrated in FIG. 1B will be described.

In Embodiment 1, CMP is employed and the bottom surface and side surfaces of the conductor 311 are surrounded by the conductor, while in this embodiment, a conductor 312 is further formed over the conductor 311. The conductor 312 preferably hardly allows oxygen to pass therethrough like the conductor 310. Alternatively, the conductor 312 preferably allows less oxygen to pass therethrough than the conductor 311. The conductor 312 can be formed using tantalum nitride, tungsten nitride, or titanium nitride, for example. Alternatively, the conductor 312 may be formed using the same conductor as the conductor 310.

Then, the conductor 312 is subjected to CMP until the insulator 303 is reached. Thus, the conductors 310, 311, and 312 are embedded in a groove to form a wiring layer as in FIG. 1B.

The wiring layer illustrated in FIG. 1B has a structure in which the bottom surface, side surfaces, and top surface of the conductor 311 are surrounded by the conductors 310 and 312, so that oxidation of the conductor 311 can be prevented. Furthermore, this embodiment is preferred to Embodiment 1 because CMP is performed one more time to further planarize the top surface of the wiring layer, thereby improving coverage with a film over the wiring layer.

Although a substrate is not illustrated in this embodiment as in Embodiment 1, a single material semiconductor substrate of silicon, germanium, or the like or a compound semiconductor substrate of silicon carbide, silicon germanium, gallium arsenide, indium phosphide, zinc oxide, gallium oxide, or the like can be used, for example. Alternatively, an insulator substrate made of quartz, glass, or the like may be used and the wiring layer formed in this embodiment can be provided above the insulator substrate. Alternatively, any of the above substrates provided with elements such as a transistor and a capacitor may be used.

At least part of this embodiment can be implemented in combination with any of the other embodiments described in this specification as appropriate.

(Embodiment 3)

Figure 3A:
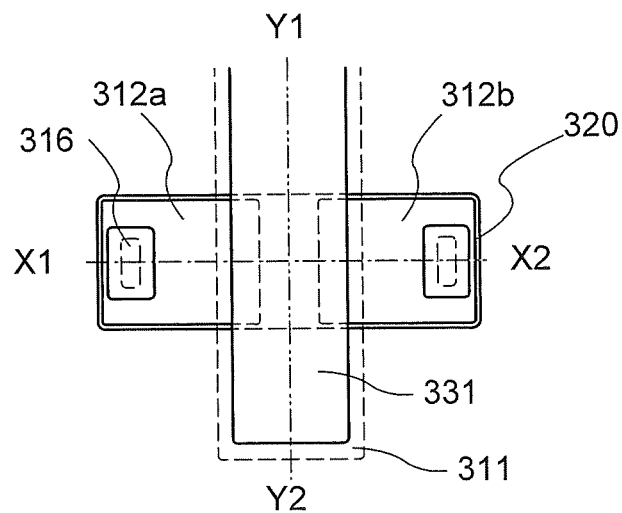
FIGS. 3A to 3C are a top view and cross-sectional views of a transistor of one embodiment of the present invention.
Figure 3B:
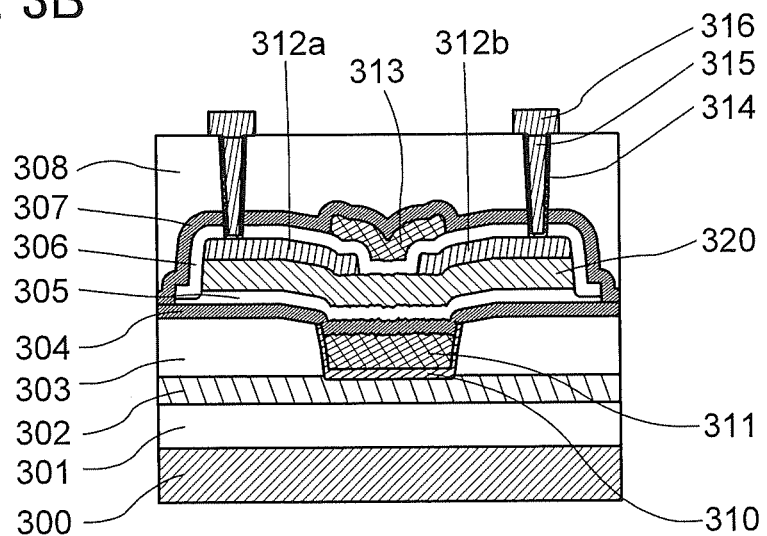
Figure 3C:
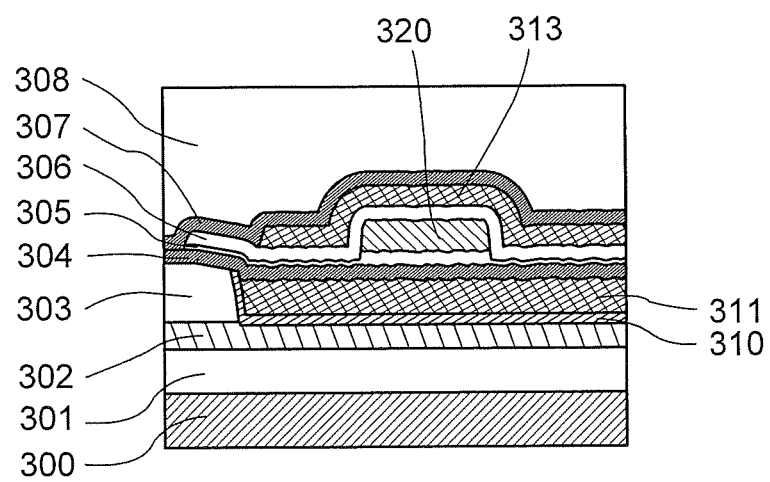

In this embodiment, an example in which the wiring layer described in Embodiment 1 is used for a transistor will be described. FIG. 3A is a top view of a transistor of one embodiment of the present invention. FIG. 3B is a cross-sectional view of the transistor in the channel length direction that is taken along the dashed-dotted line X1-X2 in FIG. 3A. FIG. 3C is a cross-sectional view of the transistor in the channel width direction that is taken along the dashed-dotted line Y1-Y2 in FIG. 3A.

As the semiconductor substrate 300, a single material semiconductor substrate of silicon, germanium, or the like or a compound semiconductor substrate of silicon carbide, silicon germanium, gallium arsenide, indium phosphide, zinc oxide, gallium oxide, or the like can be used, for example. Alternatively, an insulator substrate made of quartz, glass, or the like may be used.

The insulator 301 is formed over the substrate 300. The insulator 301 can be formed using a silicon oxide film, a silicon oxynitride film, a silicon nitride oxide film, a silicon nitride film, an aluminum oxide film, an aluminum nitride film, a hafnium oxide film, or the like by a thermal oxidation method, a CVD method, a sputtering method, an ALD method, a plasma oxidation method, a plasma nitridation method, or the like.

Next, the insulator 302 is formed over the insulator 301. Then, a wiring layer having a structure in which the bottom surface and side surfaces of the conductor 311 are surrounded by the conductor 310 is formed as in Embodiment 1. The wiring layer composed of the conductors 310 and 311 is used as a gate electrode in the transistor.

An insulator 304 is formed over the conductor 311 and the insulator 303. The insulator 304 can be formed using a film and a film formation method that are similar to those used to form the insulator 301 described above. An insulator that hardly allows oxygen to pass therethrough is preferably used; for example, an aluminum oxide film or an aluminum nitride film can be used. Consequently, the bottom surface and side surfaces of the conductor 311 are surrounded by the conductor 310, and the top surface of the conductor 311 is covered with the insulator 304. This can suppress oxidation of the conductor 311, so that a significant problem can be prevented; for example, the conductor 311 or the film in the vicinity of the conductor 311 can be prevented from being lifted or separated because of increase in the volume of the conductor 311 caused by oxidation thereof.

An insulator 305 is formed over the insulator 304. Note that the insulator 305 is preferably an insulator containing excess oxygen.

The insulator containing excess oxygen means an insulator from which oxygen is released by heat treatment, for example. A silicon oxide film containing excess oxygen means a silicon oxide film which can release oxygen by heat treatment or the like, for example. Therefore, the insulator 305 is an insulator in which oxygen can move. In other words, the insulator 305 may be an insulator having oxygen permeability. For example, the insulator 305 may be an insulator having higher oxygen permeability than the semiconductor 320.

The insulator containing excess oxygen has a function of reducing oxygen vacancies in the semiconductor 320 in some cases. Such oxygen vacancies serve as hole traps or the like. In addition, hydrogen comes into the site of such an oxygen vacancy and forms an electron serving as a carrier. Therefore, by reducing the oxygen vacancies in the oxide semiconductor 320, the transistor can have stable electrical characteristics.

Here, an insulator from which oxygen is released by heat treatment may release oxygen whose amount is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in TDS analysis in the range of a surface temperature of 100° C. to 700° C. or 100° C. to 500° C.

Here, the method for measuring the amount of released oxygen using TDS analysis will be described below.

The total amount of gas released from a measurement sample in TDS analysis is proportional to the integral value of the ion intensity of the released gas. Then, comparison with a reference sample is made, whereby the total amount of released gas can be calculated.

For example, the number of oxygen molecules ($N_{O2}$) released from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is not taken into consideration either because the proportion of such a molecule in the natural world is negligible.

$$N_{O2}=N_{H2}/S_{H2} \times S_{O2} \times \alpha$$

The value $N_{H2}$ is obtained by conversion of the amount of hydrogen molecules desorbed from the standard sample into densities. The value $S_{H2}$ is the integral value of ion intensity when the standard sample is subjected to the TDS analysis. Here, the reference value of the standard sample is set to $N_{H2}/S_{H2}$. $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing hydrogen atoms at $1 \times 10^{16}$ atoms/cm$^2$ as the reference sample.

Furthermore, in the TDS analysis, oxygen is partly detected as an oxygen atom. The ratio between oxygen molecules and oxygen atoms can be calculated from the ionization rate of the oxygen molecules. Note that since the above a includes the ionization rate of the oxygen molecules, the amount of the released oxygen atoms can also be estimated through the measurement of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in ESR.

The insulator containing excess oxygen may be formed using oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

The insulator 305 has a function as a gate insulator of the transistor. The insulator 305 can be formed using a film and a film formation method that are similar to those used to form the insulator 301 described above. Although the insulator 305 has a single-layer structure in FIGS. 3B and 3C, the insulator 305 may be a multilayer film. For example, a three-layer structure in which a silicon oxide film, a hafnium oxide film, and a silicon oxide film are stacked in this order may be employed. The hafnium oxide film may be used as an electron trap layer to control the threshold voltage of the transistor. Alternatively, a layered structure including more than three layers may be employed; a combination of any of the films for the insulator 301 that are listed above can be used.

A semiconductor 320 is formed over the insulator 305, a conductor is formed over the semiconductor 320, and then, a portion of the conductor that overlaps with a channel formation region is etched to form the channel formation region. After that, the conductor and the semiconductor 320 are etched to form a layered island-like region including source and drain electrodes (a pair of electrodes) 312a and 312b and the semiconductor 320.

Alternatively, the following procedure may be employed: before formation of the channel formation region, the conductor and the semiconductor 320 are etched to form a layered island-like region including the conductor and the semiconductor 320, and then, a portion of the conductor that overlaps with a channel formation region is etched to form the channel formation region and the source and drain electrodes 312a and 312b.

The source and drain electrodes 312a and 312b can be formed using tantalum, tungsten, titanium, molybdenum, aluminum, copper, a molybdenum-tungsten alloy, tungsten nitride, titanium nitride, or tantalum nitride, for example. Alternatively, a multilayer structure may be employed. Examples of the film formation method include a sputtering method, a CVD method, and an ALD method.

Next, an insulator 306 is formed so as to cover the source and drain electrodes 312a and 312b and the channel formation region. The insulator 306 functions as a second gate insulator of the transistor. The description of the insulator 305 can be referred to for the insulator 306.

By placing a semiconductor over and under the semiconductor 320, the electrical characteristics of the transistor can be increased in some cases. The semiconductor 320 and semiconductors placed over and under the semiconductor 320 will be described in detail below with reference to FIGS. 4A and 4B.

Figure 4A:
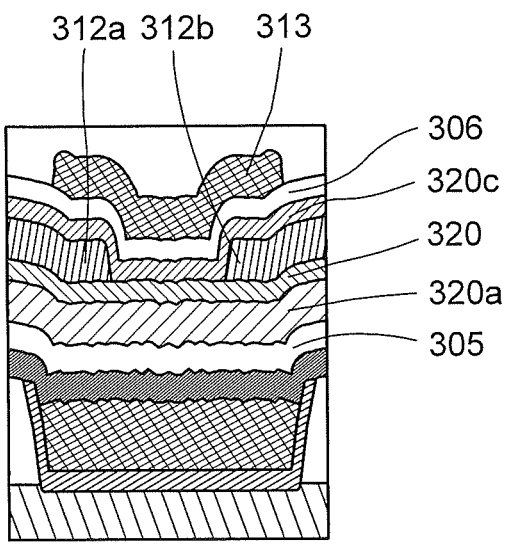
FIGS. 4A to 4C are cross-sectional views and a band diagram of a transistor of one embodiment of the present invention.
Figure 4B:
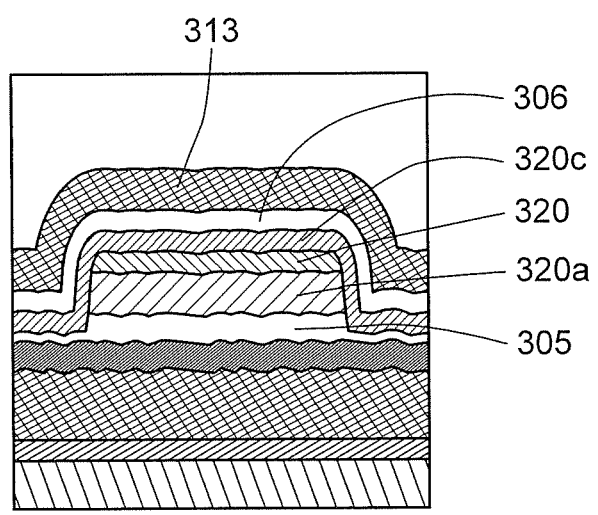

FIG. 4A is an enlarged cross-sectional view illustrating the semiconductor 320 and its vicinity of the transistor illustrated in FIG. 3B in the channel length direction. FIG. 4B is an enlarged cross-sectional view illustrating the semiconductor 320 and its vicinity of the transistor illustrated in FIG. 3C in the channel width direction.

In the transistor structure illustrated in FIGS. 4A and 4B, a semiconductor 320a is placed between the insulator 305 and the semiconductor 320. In addition, a semiconductor 320c is placed between the insulator 306 and the source and drain electrodes 312a and 312b.

The semiconductor 320 is an oxide semiconductor containing indium, for example. The oxide semiconductor 320 can have high carrier mobility (electron mobility) by containing indium, for example. The semiconductor 320 preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 320 preferably contains zinc. When the oxide semiconductor contains zinc, the oxide semiconductor is easily crystallized, in some cases.

Note that the semiconductor 320 is not limited to the oxide semiconductor containing indium. The semiconductor 320 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 320, an oxide with a wide energy gap may be used, for example. For example, the energy gap of the semiconductor 320 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

For example, the semiconductor 320a and the semiconductor 320c are oxide semiconductors including one or more elements, or two or more elements other than oxygen included in the semiconductor 320. Since the semiconductor 320a and the semiconductor 320c each include one or more elements, or two or more elements other than oxygen included in the semiconductor 320, a defect state is less likely to be formed at the interface between the semiconductor 320a and the semiconductor 320 and the interface between the semiconductor 320 and the semiconductor 320c.

The semiconductor 320a, the semiconductor 320, and the semiconductor 320c preferably include at least indium. In the case of using an In-M-Zn oxide as the semiconductor 320a, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the semiconductor 320, when the summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the semiconductor 320c, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor 320c may be an oxide that is of the same type as the semiconductor 320a. Note that the semiconductor 320a and/or the semiconductor 320c do/does not necessarily contain indium in some cases. For example, the semiconductor 320a and/or the semiconductor 320c may be gallium oxide. Note that the atomic ratios of the elements included in the semiconductor 320a, the semiconductor 320, and the semiconductor 320c are not necessarily simple ratios of integers.

As the semiconductor 320, an oxide having an electron affinity higher than those of the semiconductors 320a and 320c is used. For example, as the semiconductor 320, an oxide having an electron affinity higher than those of the semiconductors 320a and 320c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a small electron affinity and an excellent oxygen-blocking property. Therefore, the semiconductor 320c preferably includes an indium gallium oxide. The gallium atomic ratio [Ga/(In+Ga)] is, for example, higher than or equal to 70%, preferably higher than or equal to 80%, more preferably higher than or equal to 90%.

In that case, when a gate voltage is applied, a channel is formed in the semiconductor 320 having the highest electron affinity among the semiconductors 320a, 320, and 320c.

Figure 4C:
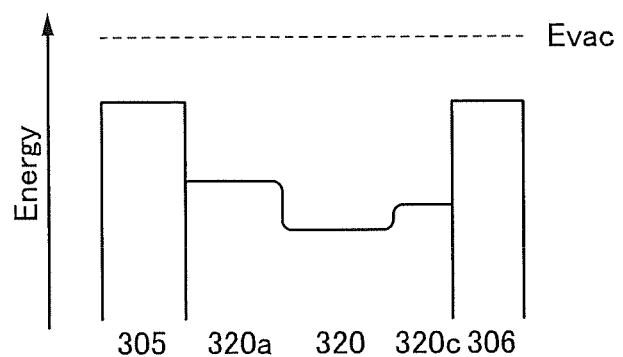

Here, in some cases, there is a mixed region of the semiconductor 320a and the semiconductor 320 between the semiconductor 320a and the semiconductor 320. Furthermore, in some cases, there is a mixed region of the semiconductor 320 and the semiconductor 320c between the semiconductor 320 and the semiconductor 320c. The mixed region has a low density of defect states. For that reason, the stack including the semiconductor 320a, the semiconductor 320, and the semiconductor 320c has a band structure where energy is changed continuously at each interface and in the vicinity of the interface (continuous junction) (see FIG. 4C). Note that boundaries of the semiconductor 320a, the semiconductor 320, and the semiconductor 320c are not clear in some cases.

At this time, electrons move mainly in the semiconductor 320, not in the semiconductor 320a and the semiconductor 320c. As described above, when the density of defect states at the interface between the semiconductor 320a and the semiconductor 320 and the density of defect states at the interface between the semiconductor 320 and the semiconductor 320c are decreased, electron movement in the semiconductor 320 is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of the top surface or the bottom surface (a formation surface; here, the semiconductor 320a) of the semiconductor 320 is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P-V) with the measurement area of 1 μm×1 μm is less than 10 nm, preferably less than 9 nm, more preferably less than 8 nm, still more preferably less than 7 nm. RMS roughness, Ra, and P-V can be measured using, for example, a scanning probe microscope SPA-500 manufactured by SII Nano Technology Inc.

The electron movement is also inhibited, for example, in the case where the density of defect states is high in a region where a channel is formed.

For example, in the case where the semiconductor 320 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 320, the on-state current of the transistor can be increased in some cases.

Furthermore, in the case where the density of defect states is high in a region where a channel is formed, the electrical characteristics of the transistor vary in some cases. For example, in the case where the defect states serve as carrier generation sources, the threshold voltage of the transistor might vary.

To decrease oxygen vacancies in the semiconductor 320, for example, there is a method in which excess oxygen in the insulator 305 is moved to the semiconductor 320 through the semiconductor 320a. In this case, the semiconductor 320a is preferably a layer having an oxygen permeability (a layer through which oxygen passes).

Moreover, the thickness of the semiconductor 320c is preferably as small as possible to increase the on-state current of the transistor. For example, the semiconductor 320c is formed to include a region having a thickness of less than 10 nm, preferably less than or equal to 5 nm, more preferably less than or equal to 3 nm. Meanwhile, the semiconductor 320c has a function of blocking entry of elements other than oxygen (such as hydrogen and silicon) included in the adjacent insulator into the semiconductor 320 where a channel is formed. For this reason, it is preferable that the semiconductor 320c have a certain thickness. For example, the semiconductor 320c is formed to include a region having a thickness of greater than or equal to 0.3 nm, preferably greater than or equal to 1 nm, more preferably greater than or equal to 2 nm. The semiconductor 320c preferably has an oxygen blocking property to suppress outward diffusion of oxygen released from the insulator 305 and the like.

To improve reliability, preferably, the thickness of the semiconductor 320a is large and the thickness of the semiconductor 320c is small. For example, the semiconductor 320a includes a region with a thickness of, for example, greater than or equal to 10 nm, preferably greater than or equal to 20 nm, more preferably greater than or equal to 40 nm, still more preferably greater than or equal to 60 nm. When the thickness of the semiconductor 320a is made large, a distance from an interface between the adjacent insulator and the semiconductor 320a to the semiconductor 320 in which a channel is formed can be large. Since the productivity of the semiconductor device might be decreased, the semiconductor 320a has a region with a thickness of, for example, less than or equal to 200 nm, preferably less than or equal to 120 nm, more preferably less than or equal to 80 nm.

For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $2\times10^{18}$ atoms/cm$^3$ is provided between the semiconductor 320 and the semiconductor 320a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $2\times10^{18}$ atoms/cm$^3$ is provided between the semiconductor 320 and the semiconductor 320c.

It is preferable to reduce the hydrogen concentration in the semiconductor 320a and the semiconductor 320c in order to reduce the hydrogen concentration in the semiconductor 320. The semiconductor 320a and the semiconductor 320c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, or still more preferably higher than or equal to $1\times10^{16}$ atoms/cm$^3$ and lower than or equal to $5\times10^{18}$ atoms/cm$^3$. It is preferable to reduce the nitrogen concentration in the semiconductor 320a and the semiconductor 320c in order to reduce the nitrogen concentration in the semiconductor 320. The semiconductor 320a and the semiconductor 320c each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, more preferably higher than or equal to $1\times10^{15}$ atoms/cm$^3$ and lower than or equal to $1\times10^{18}$ atoms/cm$^3$, or still more preferably higher than or equal to $1\times10^{15}$ atoms/cm$^3$ and lower than or equal to $5\times10^{17}$ atoms/cm$^3$.

The above three-layer structure is an example. For example, a two-layer structure without the semiconductor 320a or the semiconductor 320c may be employed. A four-layer structure in which any one of the semiconductors described as examples of the semiconductor 320a, the semiconductor 320, and the semiconductor 320c is provided under or over the semiconductor 320a or under or over the semiconductor 320c may be employed. An n-layer structure (n is an integer of 5 or more) in which any one of the semiconductors described as examples of the semiconductor 320a, the semiconductor 320, and the semiconductor 320c is provided at two or more of the following positions: over the semiconductor 320a, under the semiconductor 320a, over the semiconductor 320c, and under the semiconductor 320c.

The structure of an oxide semiconductor will be described below.

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS will be described. Note that a CAAC-OS can be referred to as an oxide semiconductor including c-axis aligned nanocrystals (CANC).

A CAAC-OS is an oxide semiconductor having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 5A:
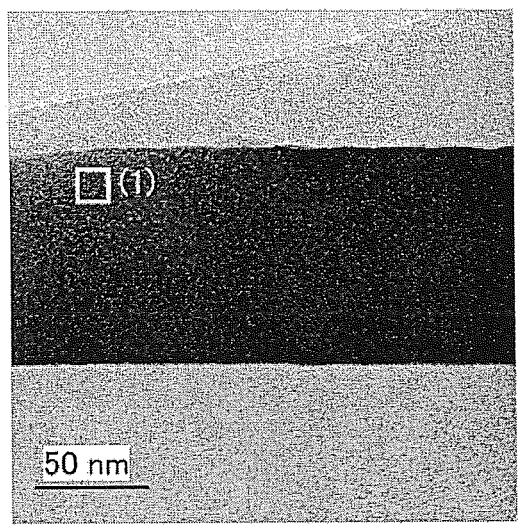
FIGS. 5A to 5D are Cs-corrected high-resolution TEM images of a cross section of a CAAC-OS and a cross-sectional schematic view of a CAAC-OS.

The CAAC-OS observed with a TEM will be described below. FIG. 5A shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 5B:
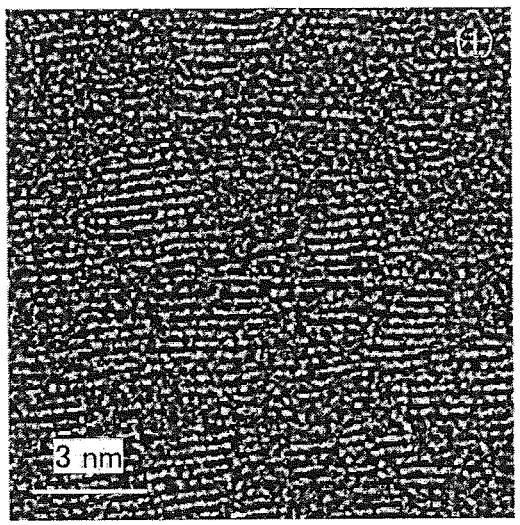

FIG. 5B is an enlarged Cs-corrected high-resolution TEM image of a region (1) in FIG. 5A. FIG. 5B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 5C:
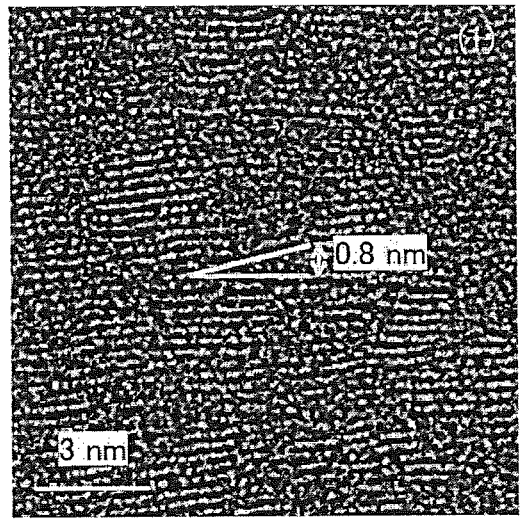

As shown in FIG. 5B, the CAAC-OS has a characteristic atomic arrangement. The characteristic atomic arrangement is denoted by an auxiliary line in FIG. 5C. FIGS. 5B and 5C prove that the size of a pellet is approximately 1 nm to 3 nm, and the size of a space caused by the tilt of the pellets is approximately 0.8 nm. Therefore, the pellet can also be referred to as a nanocrystal (nc).

Figure 5D:
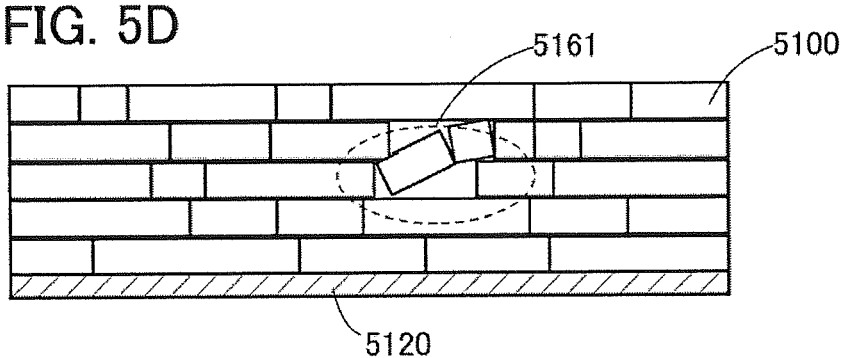

Here, according to the Cs-corrected high-resolution TEM images, the schematic arrangement of pellets 5100 of a CAAC-OS over a substrate 5120 is illustrated by such a structure in which bricks or blocks are stacked (see FIG. 5D). The part in which the pellets are tilted as observed in FIG. 5C corresponds to a region 5161 illustrated in FIG. 5D.

Figure 6A:
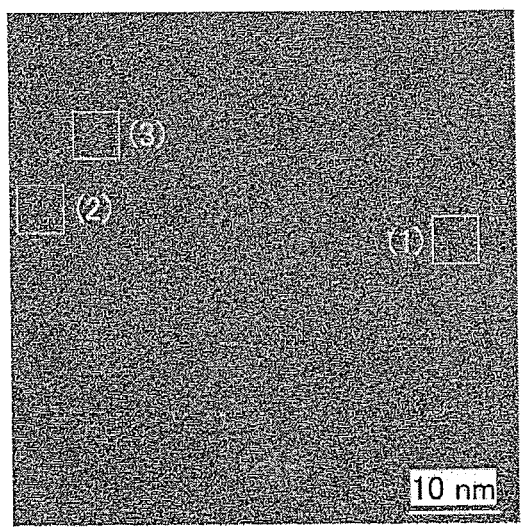
FIGS. 6A to 6D are Cs-corrected high-resolution TEM images of a plane of a CAAC-OS.
Figure 6B:
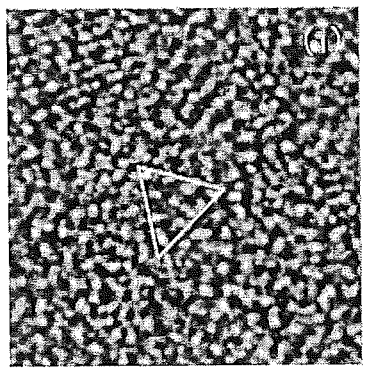
Figure 6C:
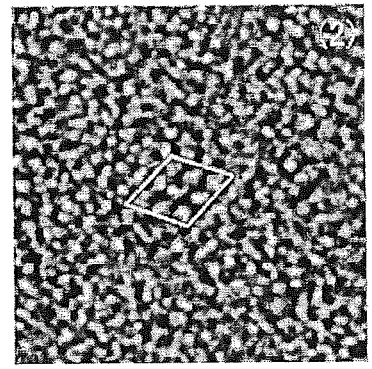
Figure 6D:
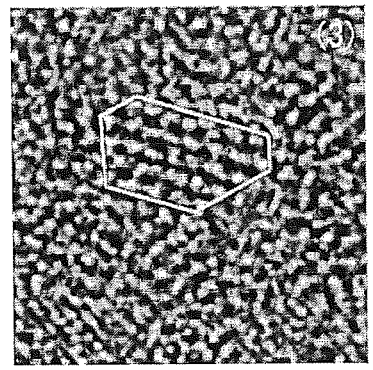

FIG. 6A shows a Cs-corrected high-resolution TEM image of a plane of the CAAC-OS film observed from the direction substantially perpendicular to the sample surface. FIGS. 6B, 6C, and 6D are enlarged Cs-corrected high-resolution TEM images of regions (1), (2), and (3) in FIG. 6A, respectively. FIGS. 6B, 6C, and 6D indicate that metal atoms are arranged in a triangular, quadrangular, or hexagonal configuration in a pellet. However, there is no regularity of arrangement of metal atoms between different pellets.

Figure 7A:
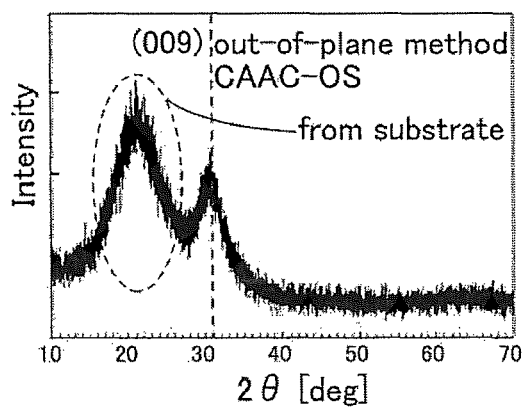
FIGS. 7A to 7C show structural analysis of a CAAC-OS and a single crystal oxide semiconductor by XRD.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle ($2\theta$) of around 31° as shown in FIG. 7A. This peak is derived from the (009) plane of the $InGaZnO_4$ crystal, which indicates that crystals in the CAAC-OS have c-axis alignment, and that the c-axes are aligned in the direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. In a preferable CAAC-OS whose structure is analyzed by an out-of-plane method, a peak appears when $2\theta$ is around 31° and no peak appears when $2\theta$ is around 36°.

Figure 7B:
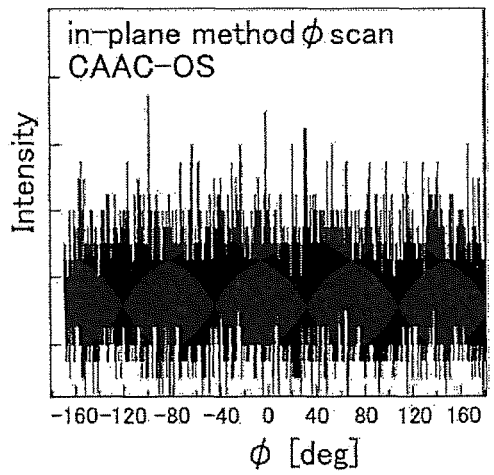
Figure 7C:
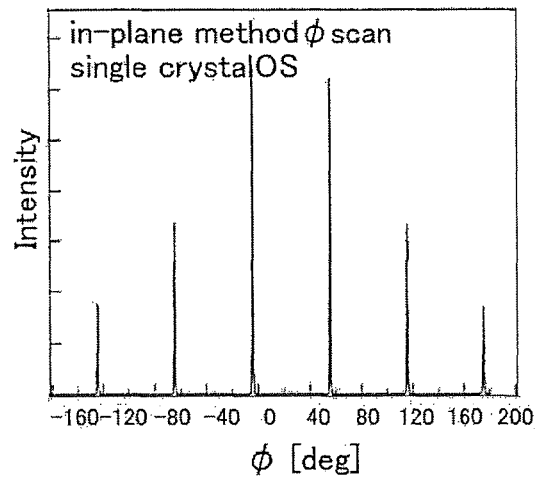

On the other hand, in structural analysis of the CAAC-OS by an in-plane method in which an X-ray is incident on a sample in the direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 7B, a peak is not clearly observed. In contrast, in the case of a single crystal oxide semiconductor of $InGaZnO_4$, when $\phi$ scan is performed with $2\theta$ fixed at around 56°, as shown in FIG. 7C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an $InGaZnO_4$ crystal in the direction parallel to the sample surface, such a diffraction pattern (also referred to as a selected-area transmission electron diffraction pattern) as is shown in FIG. 8A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 8B shows a diffraction pattern obtained in such a manner that an electron beam with a probe diameter of 300 nm is incident on the same sample in the direction perpendicular to the sample surface. As shown in FIG. 8B, a ring-like diffraction pattern is observed. Thus, the electron diffraction also indicates that the a-axes and b-axes of the pellets included in the CAAC-OS do not have regular alignment. The first ring in FIG. 8B is considered to be derived from the (010) plane, the (100) plane, and the like of the $InGaZnO_4$ crystal. The second ring in FIG. 8B is considered to be derived from the (110) plane and the like.

Moreover, the CAAC-OS is an oxide semiconductor having a low density of defect states. Defects in the oxide semiconductor are, for example, a defect due to an impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor might serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. Electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variations in electrical characteristics and high reliability.

Since the CAAC-OS has a low density of defect states, carriers generated by light irradiation or the like are less likely to be trapped in defect states. Therefore, in a transistor using the CAAC-OS, a change in electrical characteristics due to irradiation with visible light or ultraviolet light is small.

Next, a microcrystalline oxide semiconductor will be described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Furthermore, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

Next, an amorphous oxide semiconductor will be described.

The amorphous oxide semiconductor is an oxide semiconductor having disordered atomic arrangement and no crystal part and exemplified by an oxide semiconductor that exists in an amorphous state, such as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak that shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all may be called a completely amorphous structure. Meanwhile, a structure that has ordering within the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

Note that an oxide semiconductor may have a structure between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation will be described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 9:
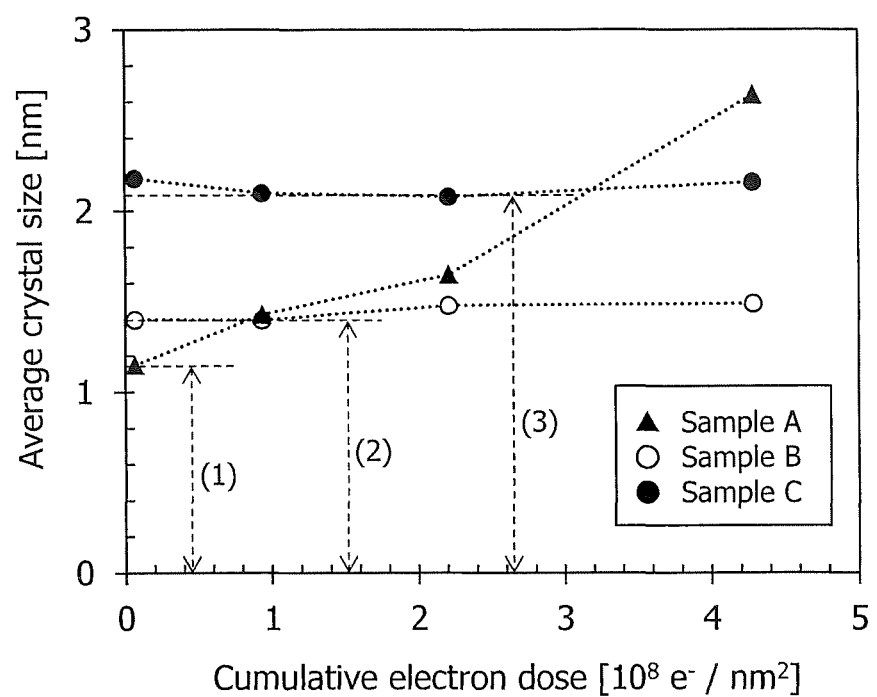
FIG. 9 shows a change in a crystal part of an In—Ga—Zn oxide by electron irradiation.

FIG. 9 shows change in the average size of crystal parts (at 22 points to 45 points) in each sample. Note that the crystal part size corresponds to the length of a lattice fringe. FIG. 9 indicates that the crystal part size in the a-like OS increases with an increase in the cumulative electron dose.

Specifically, as shown by (1) in FIG. 9, a crystal part of approximately 1.2 nm (also referred to as an initial nucleus) at the start of TEM observation grows to a size of approximately 2.6 nm at a cumulative electron dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. Specifically, as shown by (2) and (3) in FIG. 9, the average size of crystal parts in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, a microcrystalline oxide semiconductor, and a CAAC-OS, for example.

A conductor is formed over the insulator 306, and an unnecessary portion of the conductor is etched to form a second gate electrode 331. The second gate electrode can be formed using tantalum, tungsten, titanium, molybdenum, aluminum, copper, a molybdenum-tungsten alloy, tungsten nitride, titanium nitride, or tantalum nitride, for example. Alternatively, a multilayer structure may be employed. Examples of the film formation method include a sputtering method, a CVD method, and an ALD method.

Next, an insulator 307 is formed so as to cover the insulator 306 and the second gate electrode 331. The insulator 307 can be formed using a film and a film formation method that are similar to those used to form the insulator 305 described above. An insulator that hardly allows oxygen to pass therethrough is preferably used; for example, an aluminum oxide film is used.

An insulator 308 is formed over the insulator 307. The insulator 308 can be formed using a film and a film formation method that are similar to those used to form the insulator 301 described above. After the formation of the insulator 308, CMP is performed to planarize the insulator 308.

Then, contact holes are formed in the insulator 308, the insulator 307, and the insulator 306 so as to reach the top surfaces of the source and drain electrodes 312a and 312b.

Next, a conductor 314 and a conductor 315 are formed in this order. The conductors 314 and 315 can be formed using tantalum, tungsten, titanium, molybdenum, aluminum, copper, a molybdenum-tungsten alloy, tungsten nitride, titanium nitride, or tantalum nitride, for example. Examples of the film formation method include a sputtering method, a CVD method, and an ALD method.

Then, CMP is performed until the top surface of the insulator 308 is reached, whereby a plug composed of the conductors 314 and 315 is formed.

After that, a conductor 316 is formed over the conductor 315 and the insulator 308. The conductor 316 can be formed using tantalum, tungsten, titanium, molybdenum, aluminum, copper, a molybdenum-tungsten alloy, tungsten nitride, titanium nitride, or tantalum nitride, for example. Alternatively, the conductor 316 may be a multilayer film. Examples of the film formation method include a sputtering method, a CVD method, and an ALD method. Then, an unnecessary portion of the conductor 316 is etched to form an electrode composed of the conductor 316.

Through the above steps, a semiconductor device including the transistor of one embodiment of the present invention can be manufactured.

At least part of this embodiment can be implemented in combination with any of the embodiments described in this specification as appropriate.

(Embodiment 4)

In this embodiment, an example of a semiconductor device using the transistor described in Embodiment 3, which includes a back gate electrode and a wiring layer prevented from being oxidized, will be described.

Figure 10A:
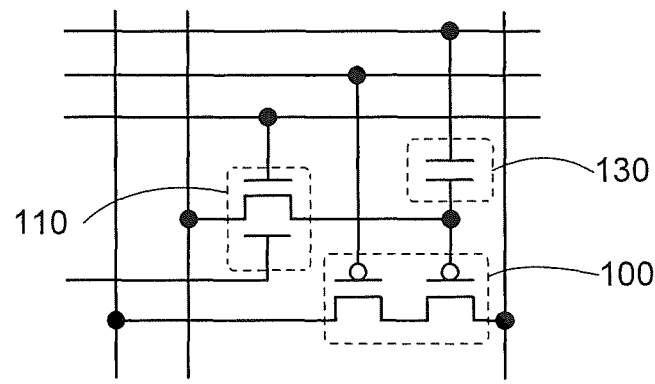
FIG. 10A is a circuit diagram of a semiconductor device of one embodiment of the present invention.
Figure 10B:
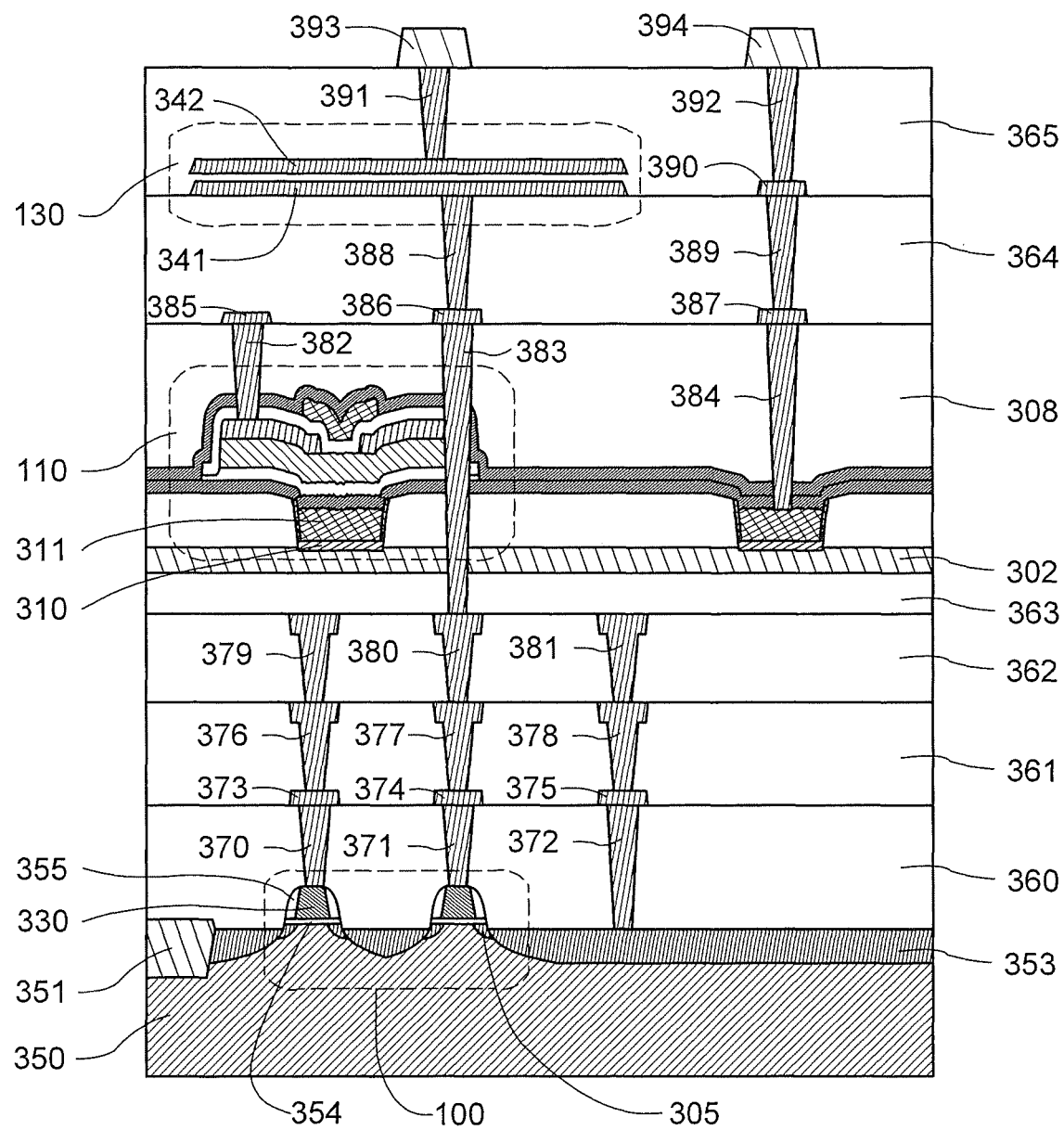
FIG. 10B is a cross-sectional view thereof.

FIG. 10A illustrates an example of a circuit of a storage device, and FIG. 10B is a cross-sectional view thereof.

As the substrate 350, a single crystal semiconductor substrate or a polycrystalline semiconductor substrate made of silicon, silicon carbide, or the like; a compound semiconductor substrate made of silicon germanium and the like; a silicon-on-insulator (SOI) substrate; or the like can be used.

Figure 11:
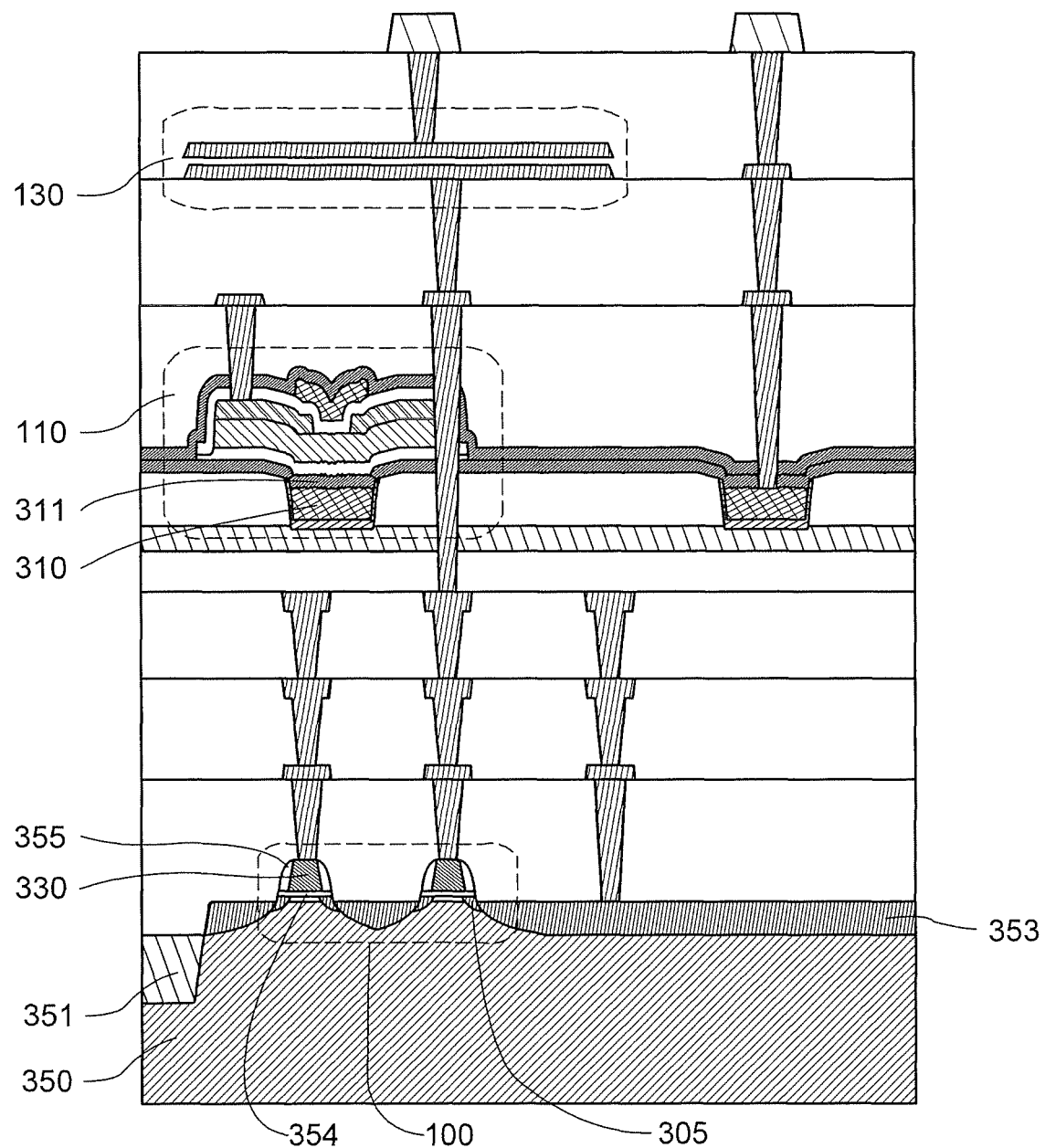
FIG. 11 is a cross-sectional view of a semiconductor device of one embodiment of the present invention.

The transistor 100 is formed over the substrate 350. The transistor 100 can be a planar transistor including sidewalls 355 as illustrated in FIG. 10B. The transistor is subjected to element isolation by forming a shallow trench isolation (STI) 351. Alternatively, the transistor may alternatively be such a Fin transistor as is illustrated in FIG. 11. Furthermore, the transistor 100 may be either a p-channel transistor or an n-channel transistor. Alternatively, both of them may be used.

Although a channel formation region of the transistor 100 includes a single crystal silicon in this embodiment, a single crystal silicon is not necessarily used; for example, an oxide semiconductor may alternatively be used for the channel formation region. Furthermore, as an insulator 354 having a function as a gate insulator, silicon oxide obtained by thermally oxidizing a single crystal silicon can be used. Alternatively, a silicon oxide film, a silicon oxynitride film, a silicon nitride oxide film, a silicon nitride film, an aluminum oxide film, an aluminum nitride film, a hafnium oxide film, or the like can be used. Examples of the film formation method include a thermal oxidation method, a CVD method, a sputtering method, an ALD method, a plasma oxidation method, and a plasma nitridation method. Alternatively, a stack of films appropriately selected from the films listed above may be used.

The insulator 360 is formed over the transistor 100, the STI 351, and the diffusion layer 353, and CMP is performed to planarize a surface of the insulator 360. The insulator 360 can be formed using a silicon oxide film, a silicon oxynitride film, a silicon nitride oxide film, a silicon nitride film, an aluminum oxide film, an aluminum nitride film, a hafnium oxide film, or the like by a thermal oxidation method, a CVD method, a sputtering method, an ALD method, a plasma oxidation method, a plasma nitridation method, or the like. For the planarization, other treatment may be employed instead of CMP, and CMP may be combined with etching (dry etching or wet etching), plasma treatment, or the like.

Contact holes that reach the top surfaces of the gate electrodes 330 of the transistor 100 and a contact hole that reaches the top surface of the diffusion layer 353 are formed in the insulator 360, a conductor is embedded in the contact holes, and CMP is performed until the top surface of the insulator 360 is exposed, so that a plug 370, a plug 371, and a plug 372 are formed. The plugs 370, 371, and 372 can be formed using tantalum, tungsten, titanium, molybdenum, aluminum, copper, or a molybdenum-tungsten alloy, for example. Alternatively, a stack of more than one films appropriately selected from the films listed above may be formed. Examples of the film formation method include a sputtering method, a CVD method, an ALD method, and a plating method. For formation of the stack, more than one methods may be employed from among the above formation methods.

Next, a conductor is formed over the insulator 360, and a wiring layer 373, a wiring layer 374, and a wiring layer 375 are formed. The wiring layers 373, 374, and 375 can be formed using a film and a film formation method that are similar to those used to form the plugs 370, 371, and 372 described above.

An insulator 361 is formed over the insulator 360 and the wiring layers 373, 374, and 375, and CMP is performed to planarize a surface of the insulator 361. The insulator 361 can be formed using a film and a film formation method that are similar to those used to form the insulator 360 described above.

Respective contact holes that reach the top surfaces of the wiring layers 373, 374, and 375 and grooves are formed in the insulator 361, and a conductor is embedded in the contact holes and the grooves. Then, CMP is performed until the top surface of the insulator 361 is exposed, so that a wiring layer 376, a wiring layer 377, and a wiring layer 378 that also serve as plugs are formed. The wiring layers 376, 377, and 378 can be formed using a film and a film formation method that are similar to those used to form the plugs 370, 371, and 372 described above.

An insulator 362 is formed over the insulator 361 and the wiring layers 376, 377, and 378, and a wiring layer 379, a wiring layer 380, and a wiring layer 381 that also serve as plugs are formed by a method similar to that used to form the insulator 361. The insulator 362 can be formed using a film and a film formation method that are similar to those used to form the insulator 360 described above. The wiring layers 379, 380, and 381 can be formed using a film and a film formation method that are similar to those used to form the plugs 370, 371, and 372 described above. The wiring layers that also serve as plugs can be formed by repeating the aforementioned method as necessary, so that a highly integrated semiconductor device can be manufactured.

An insulator 363 is formed over the insulator 362 and the wiring layers 379, 380, and 381 with the use of a film and a film formation method that are similar to those used to form the insulator 360 described above. The insulator 363 preferably hardly allows hydrogen to pass therethrough. Note that the insulator 363 is not necessarily formed.

An insulator 302 is formed over the insulator 363, and a transistor 110 is formed by the method described in Embodiment 3.

Next, the insulator 308 is formed, and a plug 382, a plug 383, and a plug 384 are formed. A wiring layer 385, a wiring layer 386, and a wiring layer 387 are formed over the plug 382, the plug 383, and the plug 384, respectively.

Then, an insulator 364 is formed over the insulator 308 and the wiring layers 385, 386, and 387, and CMP is performed to planarize a surface of the insulator 364. The insulator 364 can be formed using a film and a film formation method that are similar to those used to form the insulator 360 described above.

Contact holes that reach the top surfaces of the wiring layers 386 and 387 are formed in the insulator 364, and a conductor is embedded in the contact holes. Then, CMP is performed until the top surface of the insulator 364 is exposed, so that a plug 388 and a plug 389 are formed. The plugs 388 and 389 can be formed using a film and a film formation method that are similar to those used to form the plugs 370, 371, and 372 described above.

Then, a conductor is formed over the insulator 364, and one electrode 341 of a capacitor 130 and a wiring layer 390 are formed. The electrode 341 and the wiring layer 390 can be formed using a film and a film formation method that are similar to those used to form the plugs 370, 371, and 372 described above. Next, the capacitor 130 is formed such that the other electrode 342 overlaps with the one electrode 341 with an insulator interposed therebetween. After that, an insulator 365 is formed, and CMP is performed to planarize a surface of the insulator 365. The insulator 365 can be formed using a film and a film formation method that are similar to those used to form the insulator 360 described above.

A contact hole that reaches the top surface of the other electrode 342 of the capacitor 130 and a contact hole that reaches the top surface of the wiring layer 390 are formed in the insulator 365, and a conductor is embedded in the contact holes. Then, CMP is performed until the top surface of the insulator 365 is exposed, so that a plug 391 and a plug 392 are formed. The plugs 391 and 392 can be formed using a film and a film formation method that are similar to those used to form the plugs 370, 371, and 372 described above.

Next, a conductor is formed over the insulator 365, and a wiring layer 393 and a wiring layer 394 are formed. The wiring layers 393 and 394 can be formed using a film and a film formation method that are similar to those used to form the plugs 370, 371, and 372 described above.

Figure 12:
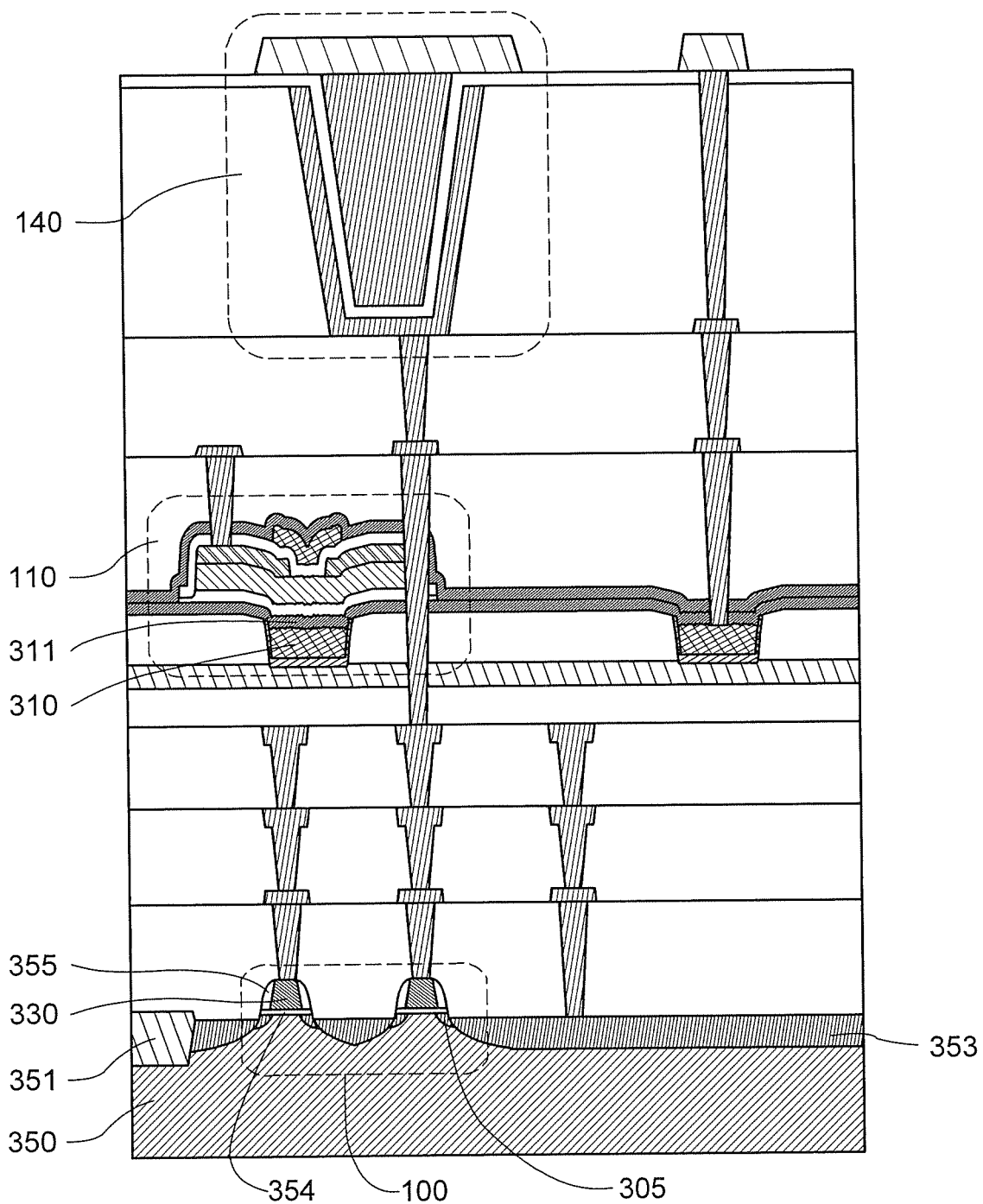
FIG. 12 is a cross-sectional view of a semiconductor device of one embodiment of the present invention.

The capacitor 130 may be formed like a cylinder capacitor 140 illustrated in FIG. 12 instead of the planar capacitor described in FIGS. 10A and 10B. The cylinder capacitor 140 is preferred to the planar capacitor 130 because it can be formed in a smaller area.

Through the above steps, the semiconductor device in one embodiment of the present invention can be manufactured.

At least part of this embodiment can be implemented in combination with any of the other embodiments described in this specification as appropriate.

(Embodiment 5)

<Imaging Device>

An imaging device of one embodiment of the present invention will be described below.

Figure 13A:
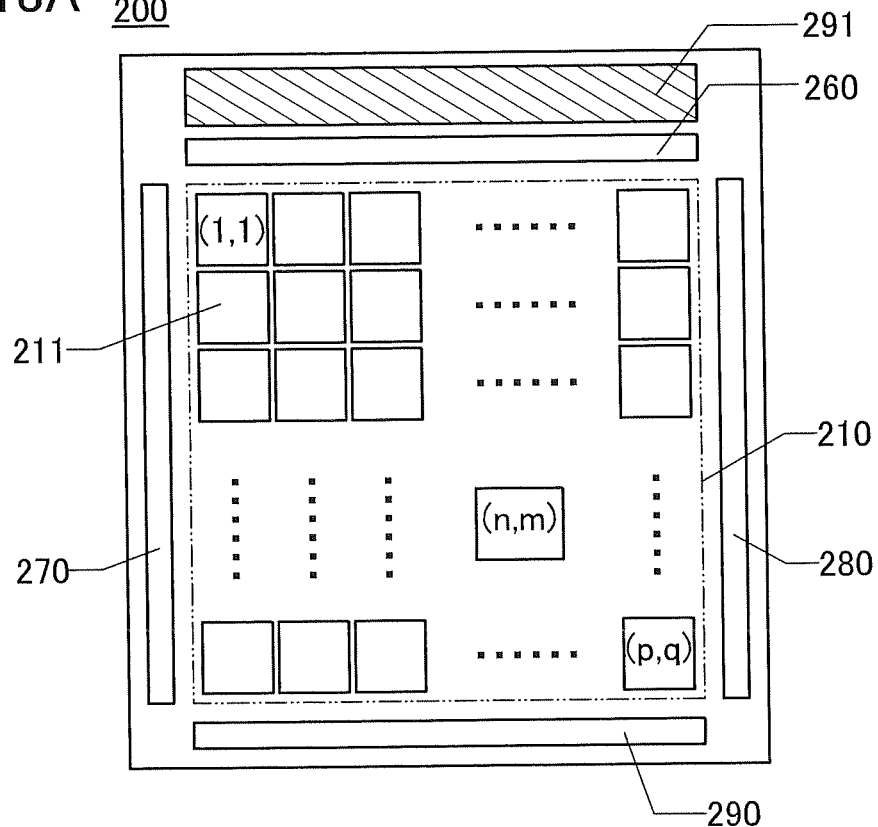
FIGS. 13A and 13B are top views each illustrating a semiconductor device of one embodiment of the present invention.

FIG. 13A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix of p rows and q columns (p and q are each an integer of 2 or more). The peripheral circuit 260, the peripheral circuit 270, the peripheral circuit 280, and the peripheral circuit 290 are each connected to a plurality of pixels 211 and each have a function of supplying a signal for driving the plurality of pixels 211. In this specification and the like, in some cases, "a peripheral circuit" or "a driver circuit" indicate all of the peripheral circuits 260, 270, 280, and 290. For example, the peripheral circuit 260 can be regarded as part of the peripheral circuit.

In addition, the imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Part or the whole of the peripheral circuit may be mounted using a semiconductor device such as an IC. Note that as the peripheral circuit, one or more of the peripheral circuits 260, 270, 280, and 290 may be omitted.

Figure 13B:
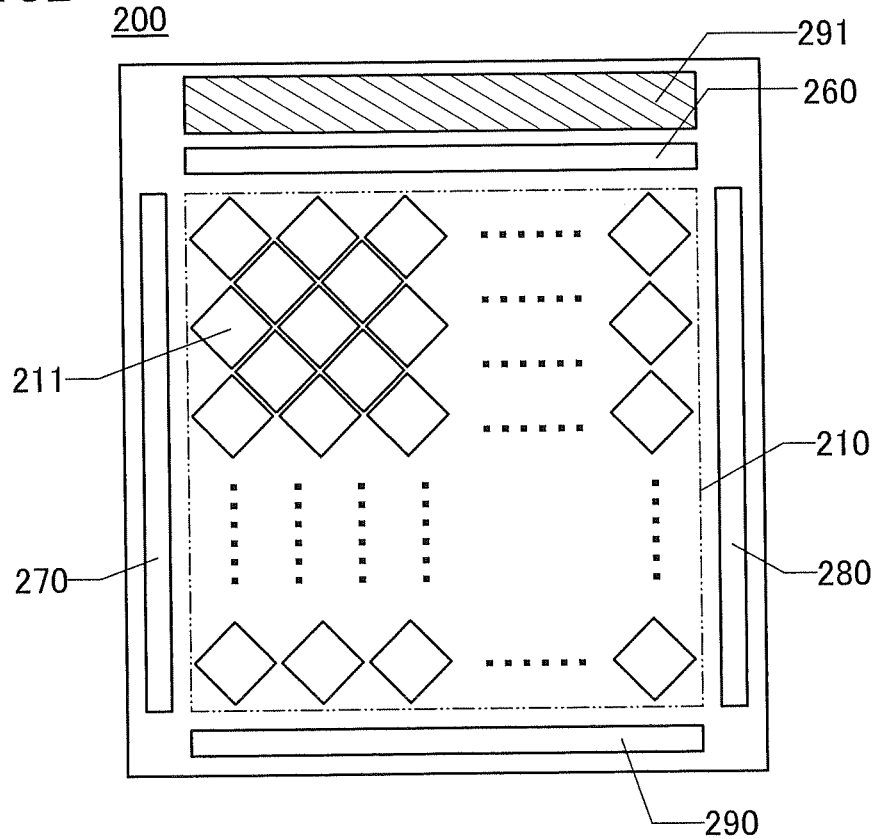

As illustrated in FIG. 13B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 14A:
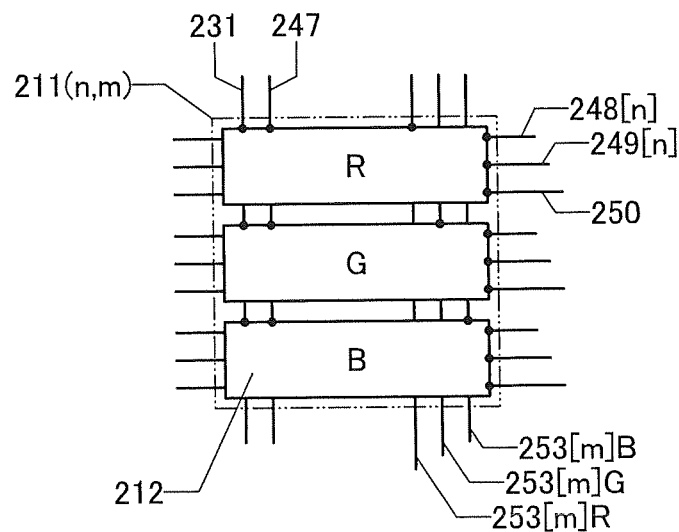
FIGS. 14A and 14B are block diagrams each illustrating a semiconductor device of one embodiment of the present invention.

FIG. 14A is a plan view showing an example of the pixel 211 with which a color image is obtained. The pixel 211 illustrated in FIG. 14A includes a subpixel 212 provided with a color filter that transmits light with a red (R) wavelength band (also referred to as a subpixel 212R), a subpixel 212 provided with a color filter that transmits light with a green (G) wavelength band (also referred to as a subpixel 212G), and a subpixel 212 provided with a color filter that transmits light with a blue (B) wavelength band (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 14A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 14B:
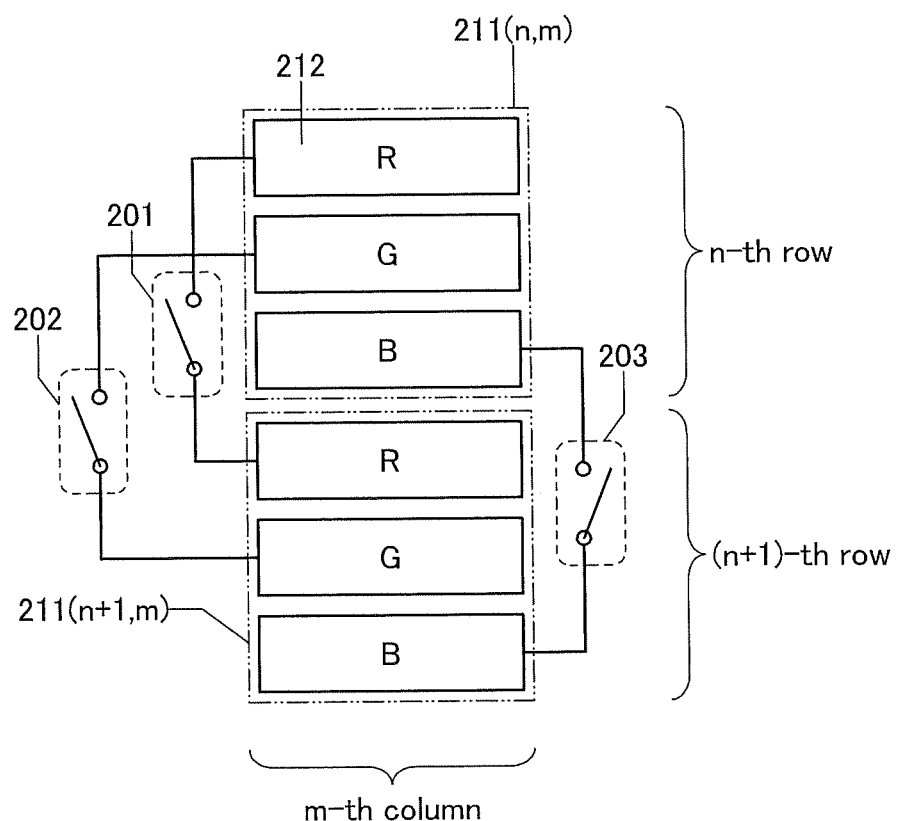

The imaging device 200 has a structure in which the subpixel 212 is electrically connected to the subpixel 212 in an adjacent pixel 211 which is provided with a color filter that transmits light with the same wavelength band as the subpixel 212, via a switch. FIG. 14B shows a connection example of the subpixels 212: the subpixel 212 in the pixel 211 arranged in an n-th (n is an integer greater than or equal to 1 and less than or equal to p) row and an m-th (m is an integer greater than or equal to 1 and less than or equal to q) column and the subpixel 212 in the adjacent pixel 211 arranged in an (n+1)-th row and the m-th column. In FIG. 14B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter that transmits yellow (Y) light may be provided, in addition to the subpixels 212 provided with the color filters that transmits red (R), green (G), and blue (B) light. The pixel 211 including the subpixel 212 provided with a color filter that transmits blue (B) light may be provided, in addition to the subpixels 212 provided with the color filters that transmits cyan (C), yellow (Y), and magenta (M) light. When the subpixels 212 that sense light with four different wavelength bands are provided in one pixel 211, the reproducibility of colors of an obtained image can be increased.

For example, in FIG. 14A, in regard to the subpixel 212 that senses a red wavelength band, the subpixel 212 that senses a green wavelength band, and the subpixel 212 that senses a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 that senses the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be provided.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 will be described with reference to cross-sectional views in FIGS. 15A and 15B. With the lens 255, the photoelectric conversion element can receive incident light efficiently. Specifically, as illustrated in FIG. 15A, light 256 enters a photoelectric conversion element 220 through the lens 255, the filter 254 (a filter 254R, a filter 254G, and a filter 254B), a pixel circuit 230, and the like which are provided in the pixel 211.

However, part of the light 256 indicated by arrows might be blocked by some wirings 257 as indicated by a region surrounded with dashed-dotted lines. Thus, a preferable structure is that the lens 255 and the filter 254 are provided on the photoelectric conversion element 220 side so that the photoelectric conversion element 220 can efficiently receive the light 256 as illustrated in FIG. 15B. When the light 256 enters the photoelectric conversion element 220 from the photoelectric conversion element 220 side, the imaging device 200 with high sensitivity can be provided.

Figure 15A:
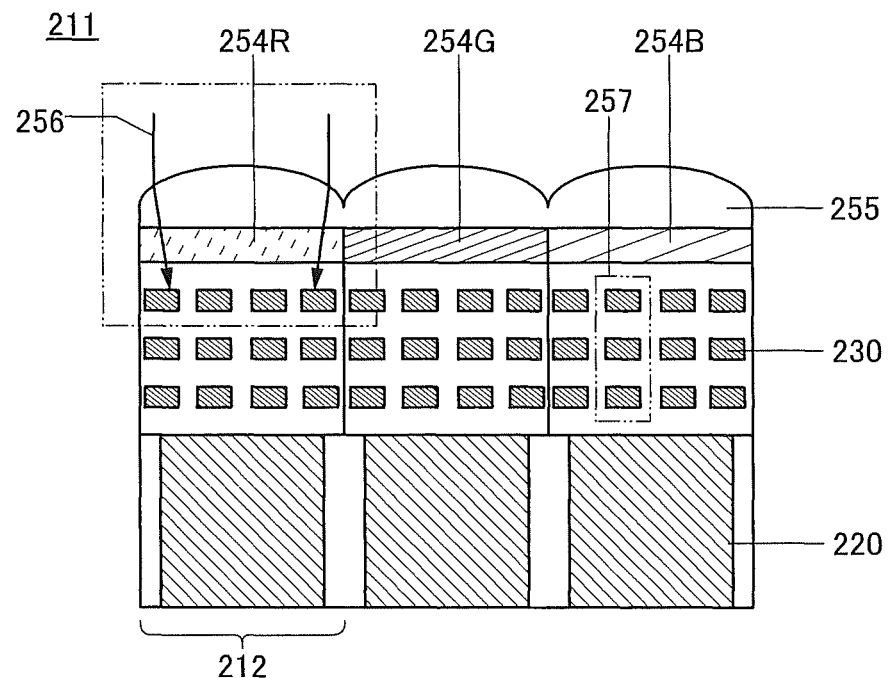
FIGS. 15A and 15B are cross-sectional views each illustrating a semiconductor device of one embodiment of the present invention.
Figure 15B:
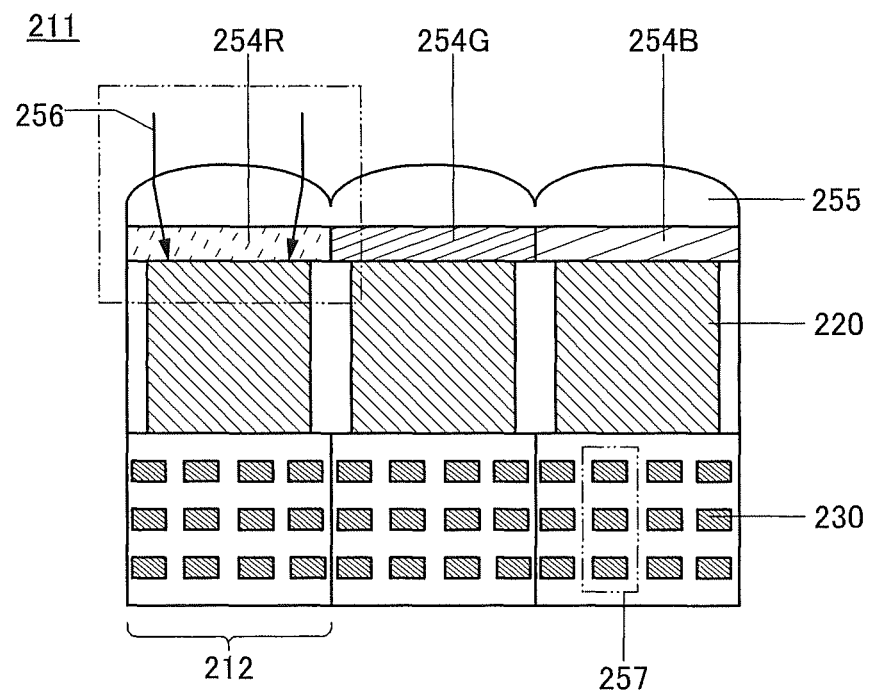

As the photoelectric conversion element 220 illustrated in FIGS. 15A and 15B, a photoelectric conversion element in which a p-n junction or a p-i-n junction is formed may be used.

The photoelectric conversion element 220 may be formed using a substance that has a function of absorbing a radiation and generating electric charge. Examples of the substance that has a function of absorbing a radiation and generating electric charge include selenium, lead iodide, mercury iodide, gallium arsenide, cadmium telluride, and a cadmium-zinc alloy.

For example, when selenium is used for the photoelectric conversion element 220, the photoelectric conversion element 220 can have an absorption coefficient of light in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 14A and 14B.

<Configuration Example 2 of Pixel>

An example of a pixel including a transistor using silicon and a transistor using an oxide semiconductor will be described below.

Figure 16A:
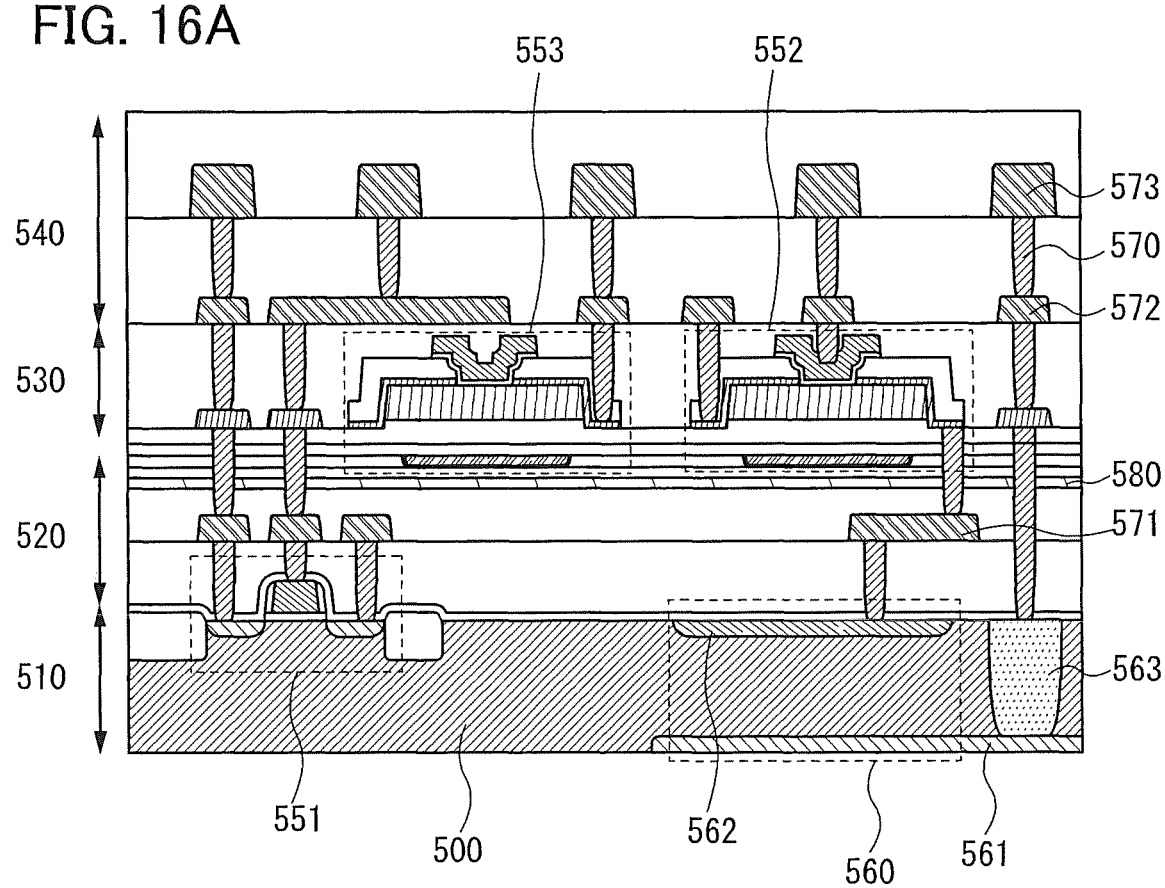
FIGS. 16A and 16B are cross-sectional views each illustrating a semiconductor device of one embodiment of the present invention.
Figure 16B:
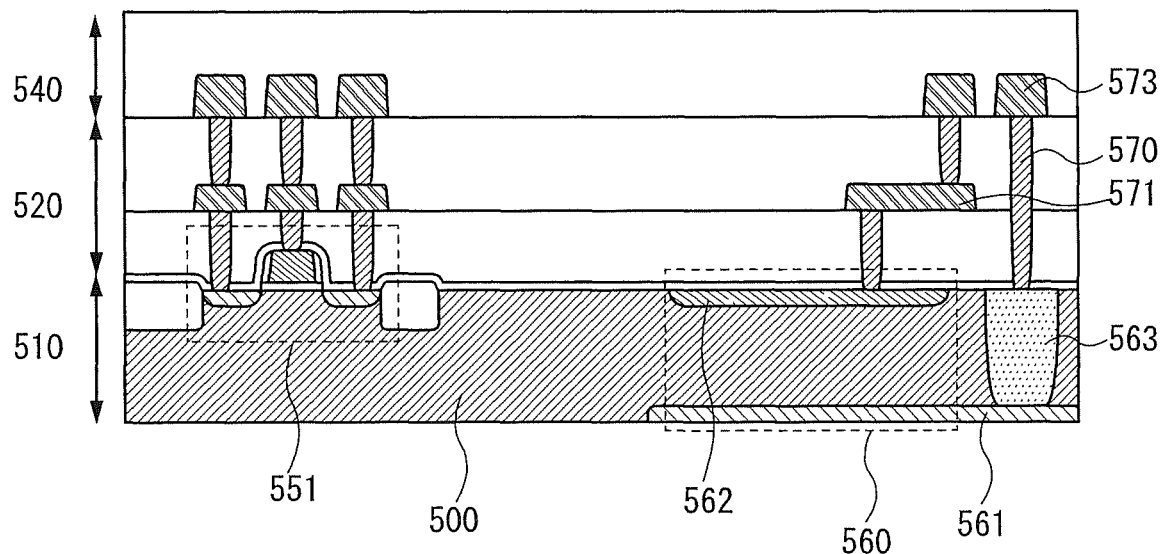

FIGS. 16A and 16B are each a cross-sectional view of an element included in an imaging device. The imaging device illustrated in FIG. 16A includes a transistor 551 including silicon on a silicon substrate 500, transistors 552 and 553 which include an oxide semiconductor and are stacked over the transistor 551, and a photodiode 560 provided in a silicon substrate 500. The transistors and the photodiode 560 are electrically connected to various plugs 570 and wirings 571. In addition, an anode 561 of the photodiode 560 is electrically connected to the plug 570 through a low-resistance region 563.

The imaging device includes a layer 510 including the transistor 551 provided on the silicon substrate 500 and the photodiode 560 provided in the silicon substrate 500, a layer 520 which is in contact with the layer 510 and includes the wirings 571, a layer 530 which is in contact with the layer 520 and includes the transistors 552 and 553, and a layer 540 which is in contact with the layer 530 and includes a wiring 572 and a wiring 573.

In the example of cross-sectional view in FIG. 16A, a light-receiving surface of the photodiode 560 is provided on the side opposite to a surface of the silicon substrate 500 where the transistor 551 is formed. With this structure, a light path can be secured without an influence of the transistors and the wirings. Thus, a pixel with a high aperture ratio can be formed. Note that the light-receiving surface of the photodiode 560 can be the same as the surface where the transistor 551 is formed.

In the case where a pixel is formed with the use of transistors including an oxide semiconductor, the layer 530 may include the transistors. Alternatively, the layer 510 may be omitted, and the pixel may include only transistors including an oxide semiconductor.

In the case where a pixel is formed with the use of a transistor including silicon, the layer 530 may be omitted. An example of a cross-sectional view in which the layer 530 is not provided is shown in FIG. 16B.

Note that the silicon substrate 500 may be an SOI substrate. Furthermore, the silicon substrate 500 can be replaced with a substrate made of germanium, silicon germanium, silicon carbide, gallium arsenide, aluminum gallium arsenide, indium phosphide, gallium nitride, or an organic semiconductor.

Here, an insulator 580 is provided between the layer 510 including the transistor 551 and the photodiode 560 and the layer 530 including the transistors 552 and 553. However, there is no limitation on the position of the insulator 580.

Hydrogen in an insulator provided in the vicinity of a channel formation region of the transistor 551 terminates dangling bonds of silicon; accordingly, the reliability of the transistor 551 can be improved. In contrast, hydrogen in the insulator provided in the vicinity of the transistor 552, the transistor 553, and the like becomes a factor that generates a carrier in the oxide semiconductor. Thus, the hydrogen might cause a reduction of the reliability of the transistor 552, the transistor 553, and the like. Therefore, in the case where the transistor using an oxide semiconductor is provided over the transistor using a silicon-based semiconductor, it is preferable that the insulator 580 having a function of blocking hydrogen be provided between the transistors. When the hydrogen is confined below the insulator 580, the reliability of the transistor 551 can be improved. In addition, the hydrogen can be prevented from being diffused from a part below the insulator 580 to a part above the insulator 580; thus, the reliability of the transistor 552, the transistor 553, and the like can be increased.

For the insulator 580, the description of the insulator 363 is referred to, for example.

In the cross-sectional view in FIG. 16A, the photodiode 560 in the layer 510 and the transistor in the layer 530 can be formed so as to overlap each other. Thus, the degree of integration of pixels can be increased. In other words, the resolution of the imaging device can be increased.

As illustrated in FIG. 17A1 and FIG. 17B1, part or the whole of the imaging device can be bent. FIG. 17A1 illustrates the state in which the imaging device is bent in the direction of a dashed-dotted line X1-X2. FIG. 17A2 is a cross-sectional view taken along dashed-dotted line X1-X2 in FIG. 17A1. FIG. 17A3 is a cross-sectional view taken along dashed-dotted line Y1-Y2 in FIG. 17A1.

FIG. 17B1 illustrates the state where the imaging device is bent in the direction of a dashed-dotted line X3-X4 and the direction of a dashed-dotted line Y3-Y4. FIG. 17B2 is a cross-sectional view taken along dashed-dotted line X3-X4 in FIG. 17B1. FIG. 17B3 is a cross-sectional view taken along dashed-dotted line Y3-Y4 in FIG. 17B 1.

The bent imaging device enables the curvature of field and astigmatism to be reduced. Thus, the optical design of lens and the like, which is used in combination with the imaging device, can be facilitated. For example, the number of lens used for aberration correction can be reduced; accordingly, a reduction in the size or weight of electronic devices using the imaging device, and the like, can be achieved. In addition, the quality of a captured image can be improved.

(Embodiment 6)

In this embodiment, an RF tag that includes the transistor described in the above embodiment or the storage device described in the above embodiment will be described with reference to FIG. 18.

The RF tag of this embodiment includes a memory circuit, stores necessary data in the memory circuit, and transmits and receives data to/from the outside with use of contactless means, for example, wireless communication. The RF tag with these features can be used for an individual authentication system in which an object or the like is recognized by reading the individual information, for example. In order that the RF tag is used for such application, extremely high reliability is needed.

A configuration of the RF tag will be described with reference to FIG. 18. FIG. 18 is a block diagram illustrating a configuration example of an RF tag.

Figure 18:
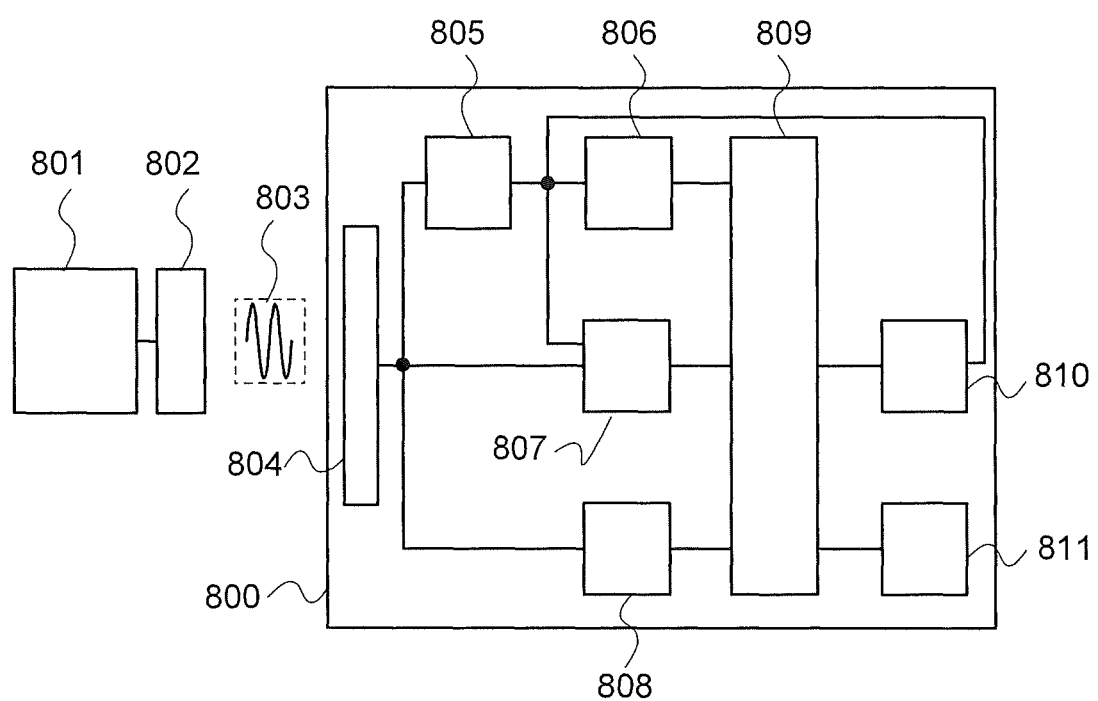
FIG. 18 is a configuration example of an RF tag of one embodiment of the present invention.

As shown in FIG. 18, an RF tag 800 includes an antenna 804 that receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress reduction of a rectifying function due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the configuration of each circuit will be described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that whether each circuit described above is provided can be determined as appropriate as needed.

Here, the memory circuit described in the above embodiment can be used as the memory circuit 810. Since the memory circuit of one embodiment of the present invention can retain data even when not powered, the memory circuit can be favorably used for an RF tag. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, putting identification numbers only to good products to be shipped is possible. Thus, the identification numbers of the shipped products are in series and customer management corresponding to the shipped products is easily performed.

At least part of this embodiment can be implemented in combination with any of the other embodiments described in this specification as appropriate.

(Embodiment 7)

In this embodiment, a CPU in which at least the transistor described in the above embodiment can be used and the storage device described in the above embodiment is included will be described.

Figure 19:
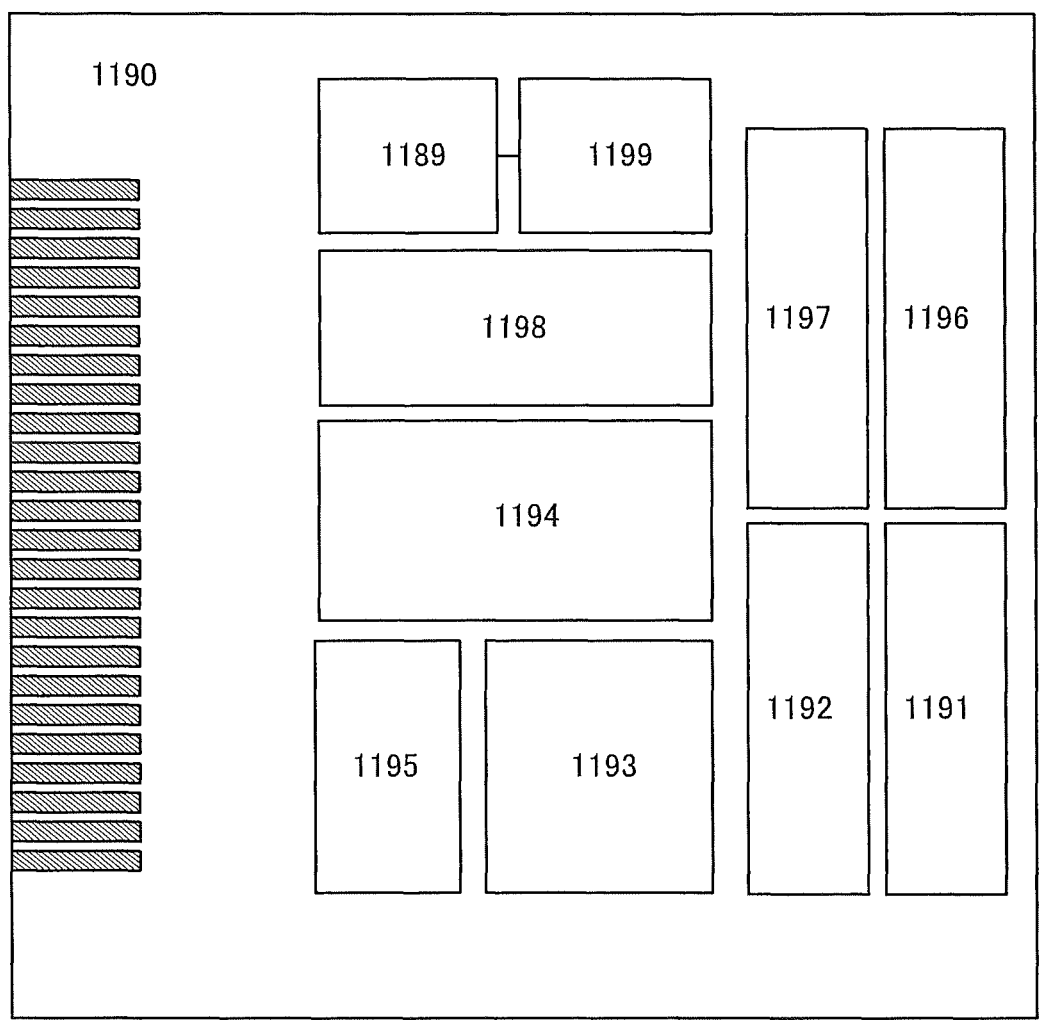
FIG. 19 is a block diagram of a semiconductor device of one embodiment of the present invention.

FIG. 19 is a block diagram illustrating a configuration example of a CPU at least partly including any of the transistors described in the above embodiments as a component.

The CPU illustrated in FIG. 19 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 19 is just an example in which the configuration is simplified, and an actual CPU may have a variety of configurations depending on the application. For example, the CPU may have the following configuration: a structure including the CPU illustrated in FIG. 19 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 19, a memory cell is provided in the register 1196. For the memory cell of the register 1196, the transistor described in the above embodiment can be used.

In the CPU illustrated in FIG. 19, the register controller 1197 selects operation of retaining data in the register 1196 in accordance with an instruction from the ALU 1191. That is, the register controller 1197 selects whether data is retained by a flip-flop or whether it is retained by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

Figure 20:
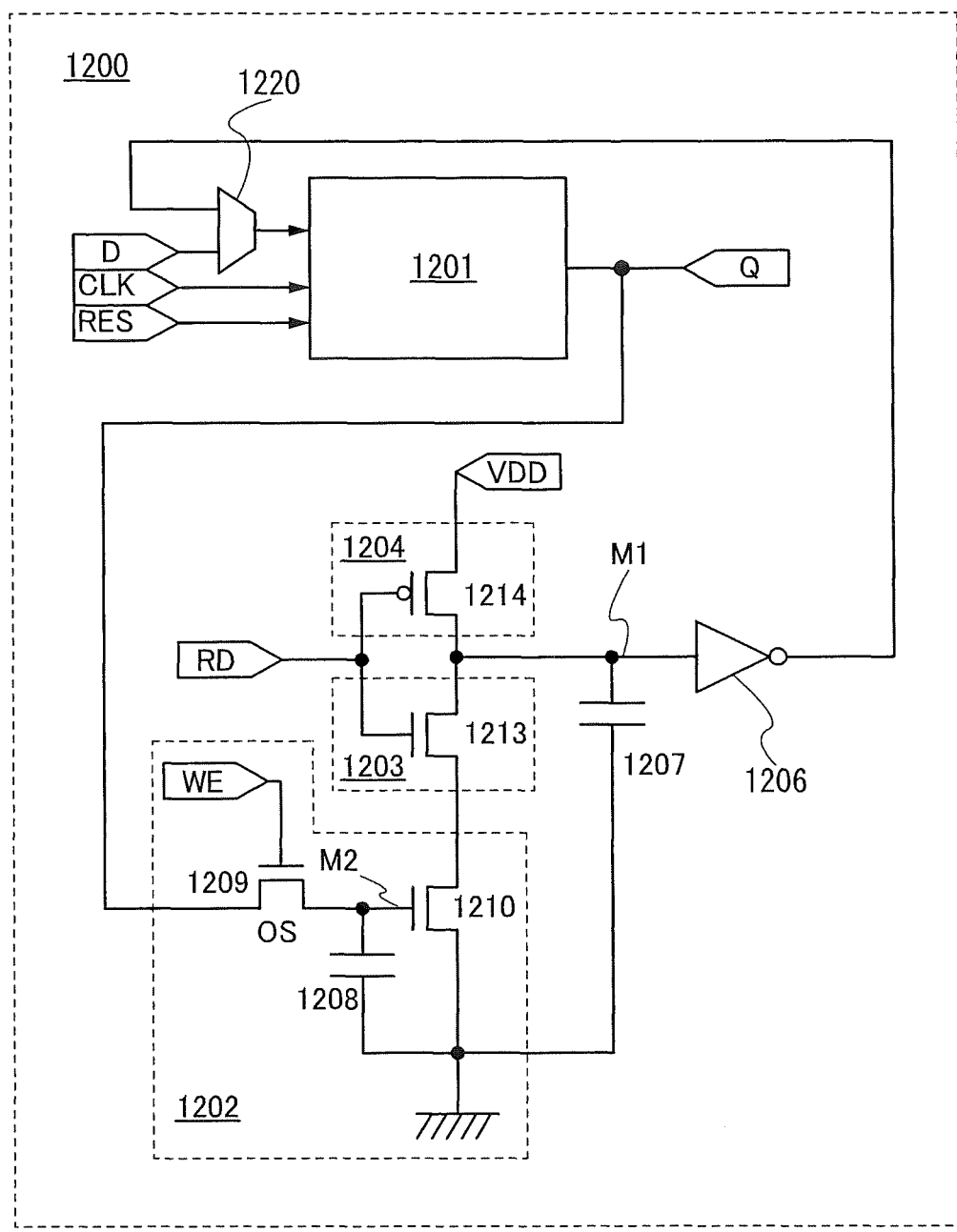
FIG. 20 is a circuit diagram illustrating a storage device of one embodiment of the present invention.

FIG. 20 is an example of a circuit diagram of a memory circuit that can be used as the register 1196. A memory circuit 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory circuit 1200 may further include another element such as a diode, a resistor, or an inductor, as needed.

Here, the storage device described in the above embodiment can be used as the circuit 1202. When supply of a power supply voltage to the memory circuit 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When one of the switches is in the conduction state between the first terminal and the second terminal, the other of the switches is in the non-conduction state between the first terminal and the second terminal.

A signal corresponding to data retained in the circuit 1201 is input to the other of the source and the drain of the transistor 1209. FIG. 20 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 20, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 20, the transistors included in the memory circuit 1200 except the transistor 1209 can each be a transistor in which a channel is formed in a layer formed using a semiconductor other than an oxide semiconductor or in the substrate 1190. For example, the transistor can be a transistor whose channel is formed in a silicon film or a silicon substrate. Alternatively, a transistor in which a channel is formed in an oxide semiconductor can be used for all the transistors in the memory circuit 1200. Still alternatively, in the memory circuit 1200, a transistor in which a channel is formed in an oxide semiconductor can be included besides the transistor 1209, and a transistor in which a channel is formed in a layer formed using a semiconductor other than an oxide semiconductor or in the substrate 1190 can be used for the rest of the transistors.

As the circuit 1201 in FIG. 20, for example, a flip-flop circuit can be used. As the logic element 1206, for example, an inverter or a clocked inverter can be used.

In a period during which the memory circuit 1200 is not supplied with a power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which a power supply voltage is not supplied to the memory circuit 1200. The memory circuit 1200 can accordingly retain the stored content (data) also in a period during which the supply of the power supply voltage is stopped.

Since the above-described memory circuit performs precharge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory circuit 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By using the above-described memory circuit 1200 for a storage device such as a register or a cache memory included in a processor, data in the storage device can be prevented from being lost owing to the stop of the supply of a power supply voltage. Furthermore, shortly after the supply of the power supply voltage is restarted, the storage device can be returned to the same state as that before the power supply is stopped. Therefore, the power supply can be stopped even for a short time in the processor or one or more of logic circuits included in the processor, resulting in lower power consumption.

Although the memory circuit 1200 is used in a CPU in this embodiment, the memory circuit 1200 can also be used in an LSI such as a digital signal processor (DSP), a custom LSI, or a programmable logic device (PLD), and a radio frequency tag (RF tag).

At least part of this embodiment can be implemented in combination with any of the other embodiments described in this specification as appropriate.

(Embodiment 8)
<Display Device>

A display device of one embodiment of the present invention will be described below with reference to FIGS. 21A to 21C and FIGS. 22A and 22B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) will be described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 21A:
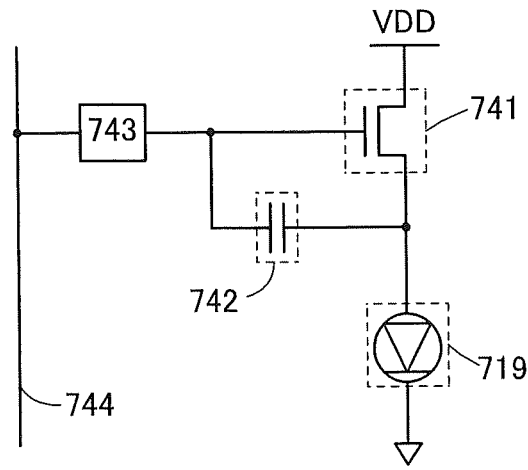
FIGS. 21A, 21B, and 21C are a circuit diagram, a top view, and a cross-sectional view illustrating a semiconductor device of one embodiment of the present invention.
Figure 21B:
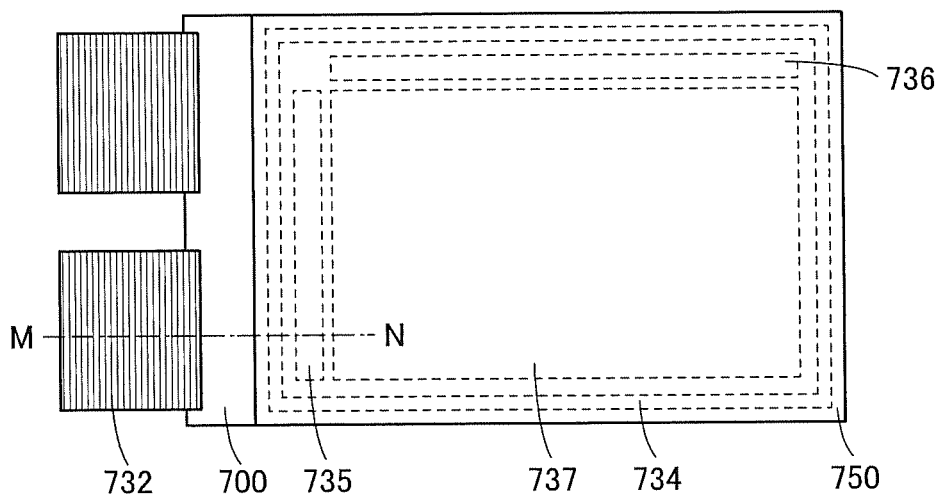
Figure 21C:
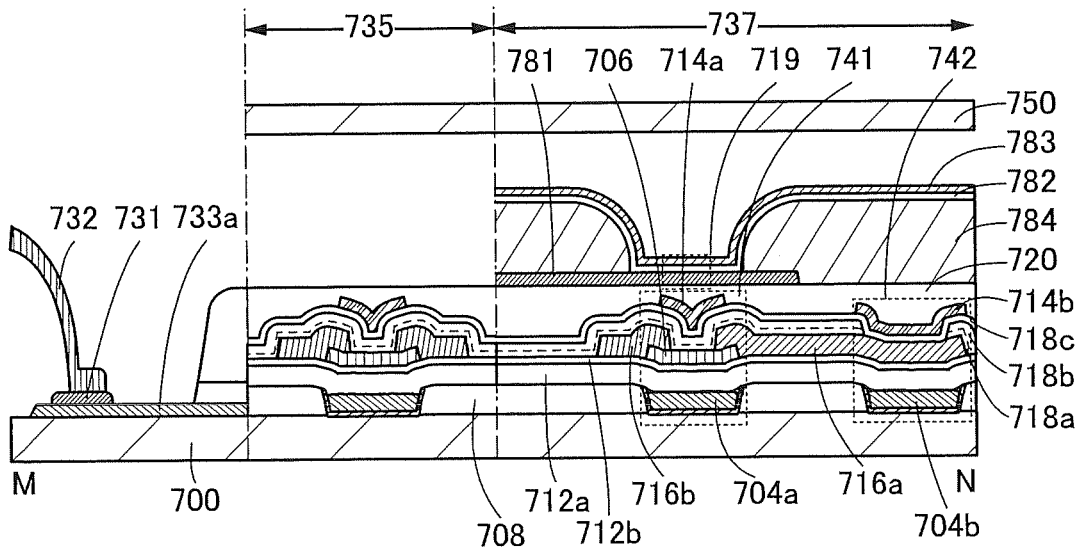

FIGS. 21A to 21C illustrate an example of an EL display device of one embodiment of the present invention. FIG.

21A is a circuit diagram of a pixel in an EL display device. FIG. 21B is a top plan view showing the whole of the EL display device. FIG. 21C is a cross-sectional view taken along part of dashed-dotted line M-N in FIG. 21B.

FIG. 21A illustrates an example of a circuit diagram of a pixel used in an EL display device.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear, and it can be determined that the embodiment is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 21A includes a switching element 743, a transistor 741, a capacitor 742, and a light-emitting element 719.

Note that FIG. 21A and the like each illustrate an example of a circuit configuration; therefore, a transistor can be provided additionally. In contrast, for each node in FIG. 21A and the like, it is possible that an additional transistor, switch, passive element, or the like not be provided.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 21B is a top plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 21C is a cross-sectional view of the EL display device taken along part of dashed-dotted line M-N in FIG. 21B.

FIG. 21C illustrates a structure of the transistor 741 including an insulator 708 over the substrate 700; a conductor 704a embedded in the insulator 708; an insulator 712a over the insulator 708 and the conductor 704a; an insulator 712b over the insulator 712a; a semiconductor 706 that is over the insulator 712b and overlaps with the conductor 704a; a conductor 716a and a conductor 716b in contact with the semiconductor 706; an insulator 718a over the semiconductor 706, the conductor 716a, and the conductor 716b; an insulator 718b over the insulator 718a; an insulator 718c over the insulator 718b; an insulator 718c over the insulator 718b; and a conductor 714a that is over the insulator 718c and overlaps with the semiconductor 706. Note that the structure of the transistor 741 is just an example; the transistor 741 may have a structure different from that illustrated in FIG. 21C. The wiring layer formed by the method described in Embodiment 1 can be used as the conductor 704a.

Thus, in the transistor 741 illustrated in FIG. 21C, the conductor 704a serves as a gate electrode, the insulator 712a and the insulator 712b serve as a gate insulator, the conductor 716a serves as a source electrode, the conductor 716b serves as a drain electrode, the insulator 718a, the insulator 718b, and the insulator 718c serve as a gate insulator, and the conductor 714a serves as a gate electrode. Note that in some cases, the electrical characteristics of the semiconductor 706 change if light enters the semiconductor 706. To prevent this, it is preferable that one or more of the conductor 704a, the conductor 716a, the conductor 716b, and the conductor 714a have a light-blocking property.

Note that the interface between the insulator 718a and the insulator 718b is indicated by a broken line. This means that the boundary between them is not clear in some cases. For example, in the case where the insulator 718a and the insulator 718b are formed using insulators of the same kind, the insulator 718a and the insulator 718b are not distinguished from each other in some cases depending on an observation method.

FIG. 21C illustrates a structure of the capacitor 742 including the insulator 708 over the substrate; a conductor 704b embedded in the insulator 708; the insulator 712a over the insulator 708 and the conductor 704b; the insulator 712b over the insulator 712a; the conductor 716a that is over the insulator 712b and overlaps with the conductor 704b; the insulator 718a over the conductor 716a; the insulator 718b over the insulator 718a; the insulator 718c over the insulator 718b; and a conductor 714b that is over the insulator 718c and overlaps with the conductor 716a. In this structure, part of the insulator 718a and part of the insulator 718b are removed in a region where the conductor 716a and the conductor 714b overlap with each other. The wiring layer formed by the method described in Embodiment 1 can be used as the conductor 704b.

In the capacitor 742, each of the conductor 704b and the conductor 714b serves as one electrode, and the conductor 716a serves as the other electrode.

Thus, the capacitor 742 can be formed using a film of the transistor 741. The conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 21C has a large capacitance per unit area occupied by the capacitor. Therefore, the EL display device illustrated in FIG. 21C has high display quality. Note that although the capacitor 742 illustrated in FIG. 21C has the structure in which the part of the insulator 718a and the part of the insulator 718b are removed to reduce the thickness of the region where the conductor 716a and the conductor 714b overlap with each other, the structure of the capacitor of one embodiment of the present invention is not limited to the structure. For example, a structure in which a part of the insulator 718c is removed to reduce the thickness of the region where the conductor 716a and the conductor 714b overlap with each other may be used.

An insulator 720 is provided over the transistor 741 and the capacitor 742. Here, the insulator 720 may have an opening reaching the conductor 716a that serves as the source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 through the opening formed in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device will be described.

Figure 22A:
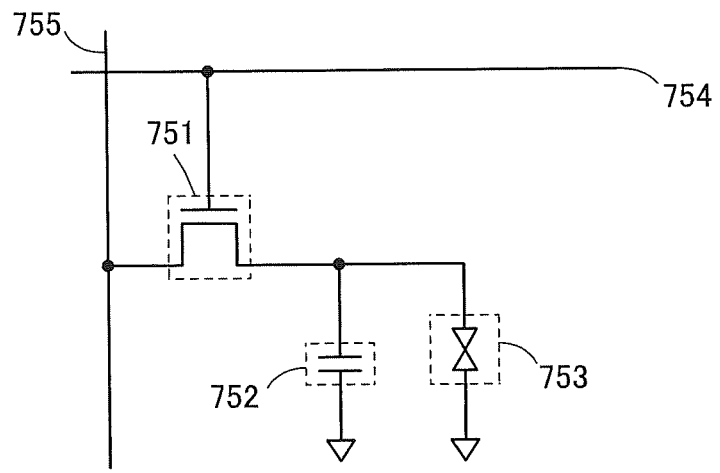
FIGS. 22A and 22B are a circuit diagram and a cross-sectional view illustrating a semiconductor device of one embodiment of the present invention.

FIG. 22A is a circuit diagram illustrating a configuration example of a pixel of a liquid crystal display device. A pixel shown in FIGS. 22A and 22B includes a transistor 751, a capacitor 752, and an element (liquid crystal element) 753 in which a space between a pair of electrodes is filled with liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 22B:
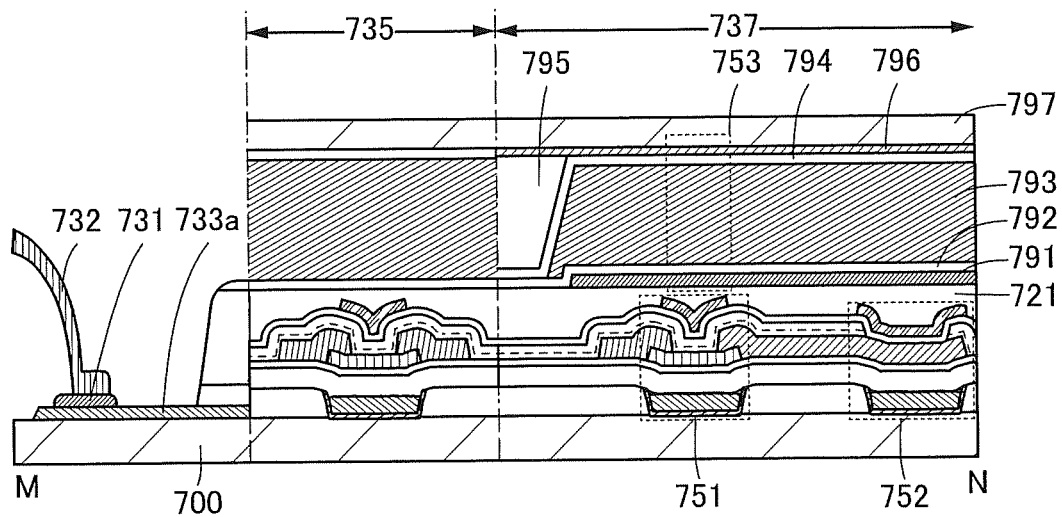

Note that the description of the liquid crystal display device is made on the assumption that the top plan view of the liquid crystal display device is similar to that of the EL display device. FIG. 22B is a cross-sectional view of the liquid crystal display device taken along dashed-dotted line M-N in FIG. 21B. In FIG. 22B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 22B corresponds to, but is not limited to, the structure of the capacitor 742 in FIG. 21C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL element (e.g., an EL element including organic and inorganic materials, an organic EL element, or an inorganic EL element), an LED (e.g., an LED for white, red, green, blue, or the like), a transistor (a transistor that emits light depending on a current), an electron emitter, a liquid crystal element, Electronic Liquid Powder (registered trademark) electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink, Electronic Liquid Powder (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductor included in the LED can also be formed by a sputtering method.

(Embodiment 9)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic appliances that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 23A to 23F illustrate specific examples of these electronic appliances.

Figure 23A:
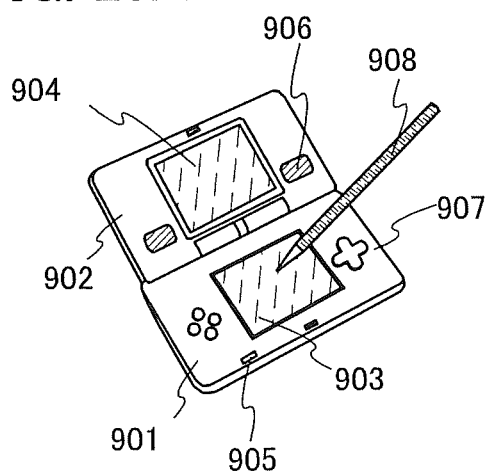
FIGS. 23A to 23F each illustrate an example of an electronic appliance of one embodiment of the present invention.

FIG. 23A illustrates a portable game machine which includes a housing 901, a housing 902, a display portion 903, a display portion 904, a microphone 905, a speaker 906, an operation key 907, a stylus 908, and the like. Although the portable game machine in FIG. 23A has the two display portions 903 and 904, the number of display portions included in a portable game machine is not limited to this.

Figure 23B:
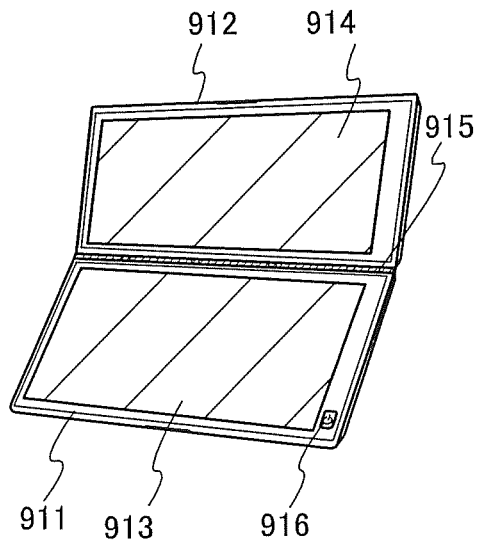

FIG. 23B illustrates a portable data terminal which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image displayed on the first display portion 913 may be changed in accordance with the angle at the joint 915 between the first housing 911 and the second housing 912. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel portion of a display device.

Figure 23C:
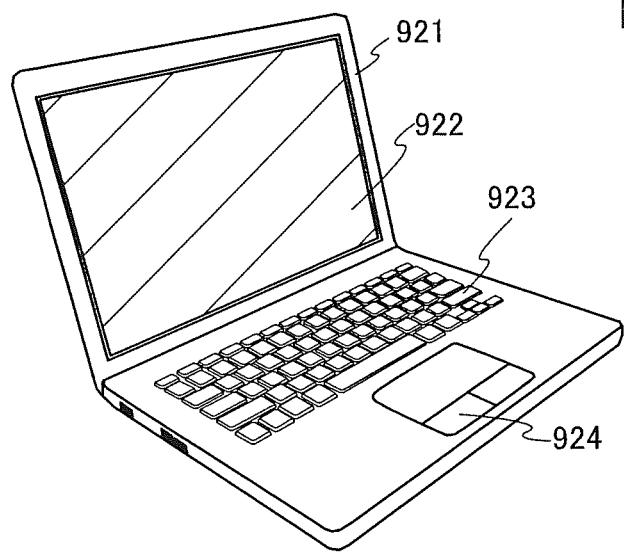

FIG. 23C illustrates a notebook personal computer which includes a housing 921, a display portion 922, a keyboard 923, a pointing device 924, and the like.

Figure 23D:
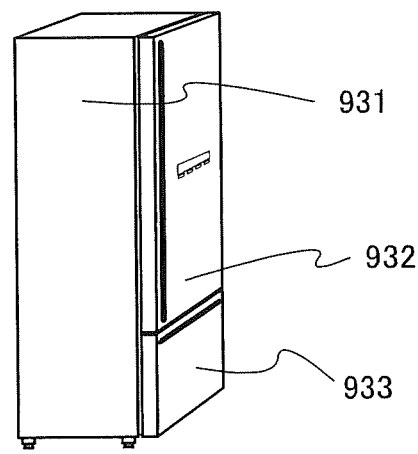

FIG. 23D illustrates an electric refrigerator-freezer which includes a housing 931, a refrigerator door 932, a freezer door 933, and the like.

Figure 23E:
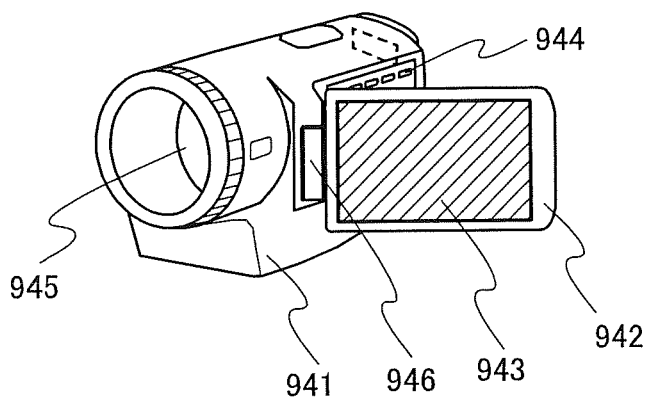

FIG. 23E illustrates a video camera which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 23F:
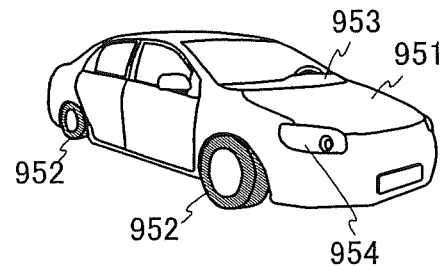
Figure 24A:
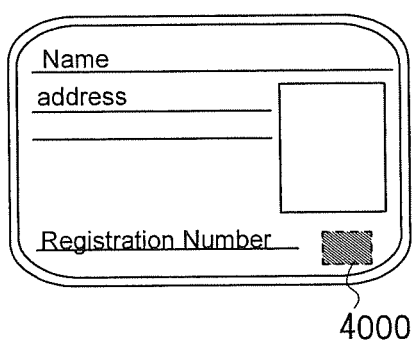
FIGS. 24A to 24F illustrate application examples of an RF tag of one embodiment of the present invention.
Figure 24B:
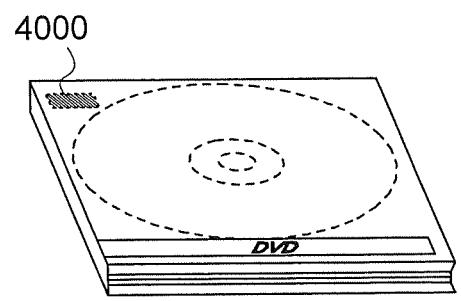
Figure 24C:
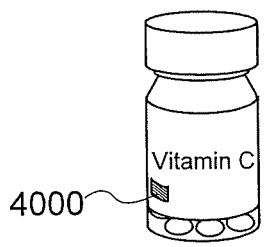
Figure 24D:
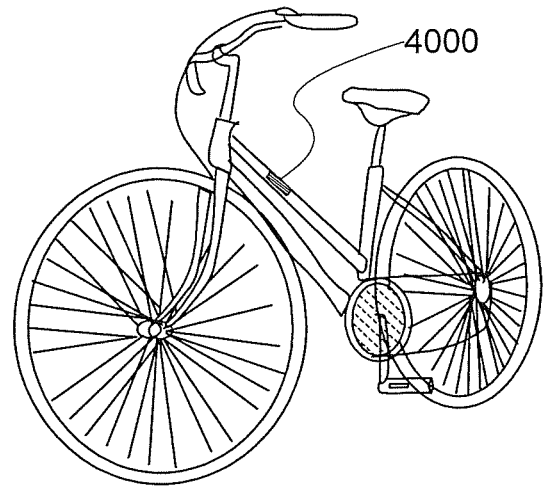
Figure 24E:
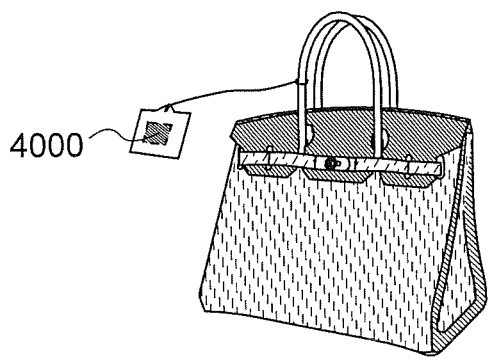
Figure 24F:
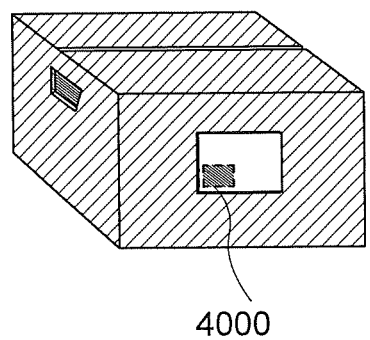

FIG. 23F illustrates a vehicle which includes a car body 951, wheels 952, a dashboard 953, lights 954, and the like.

At least part of this embodiment can be implemented in combination with any of the other embodiments described in this specification as appropriate.

(Embodiment 10)

In this embodiment, application examples of the RF tag of one embodiment of the present invention will be described with reference to FIGS. 24A to 24F. The RF tag is widely used and can be provided for, for example, products such as bills, coins, securities, bearer bonds, documents (e.g., driver's licenses or resident's cards, see FIG. 24A), recording media (e.g., DVDs or video tapes, see FIG. 24B), packaging containers (e.g., wrapping paper or bottles, see FIG. 24C), vehicles (e.g., bicycles, see FIG. 24D), personal belongings (e.g., bags or glasses), foods, plants, clothing, household goods, medical supplies such as medicine and chemicals, and electronic appliances (e.g., liquid crystal display devices, EL display devices, television sets, or cellular phones), animals, human bodies, or tags on products (see FIGS. 24E and 24F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product.

Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic appliances, or the like. Vehicles can also have a higher level of security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

At least part of this embodiment can be implemented in combination with any of the other embodiments described in this specification as appropriate.

EXAMPLE 1

In Example 1, the wiring layer of Embodiment 1 was formed, and a cross section thereof was observed with a scanning transmission electron microscope (STEM).

A thermal oxidation film was formed to a thickness of 400 nm over a single crystal silicon wafer. Then, a silicon nitride film was formed to a thickness of 50 nm by a plasma CVD method. Then, a silicon oxynitride film was formed to a thickness of 150 nm by a plasma CVD method.

Next, resist patterning was performed by electron beam exposure to form a groove in the silicon oxynitride film. The groove was formed in the silicon oxynitride film by a dry etching method using the resist pattern as a mask.

The resist was removed, and then, a conductor was formed by a metal CVD method. Titanium nitride and tungsten were successively deposited in this order to thicknesses of 5 nm and 200 nm, respectively.

Then, CMP was performed using slurry containing silica to remove portions of the tungsten and the titanium nitride that are located on the silicon oxynitride film.

After CMP, washing was performed to remove slurry and particles remaining on the substrate. The washing was performed in such a manner that the substrate was immersed in ozone water, brush washing was performed, washing with a diluted hydrofluoric acid was performed, and finally, washing with pure water and drying were performed. Through the above process, the sample was formed.

Figure 25A:
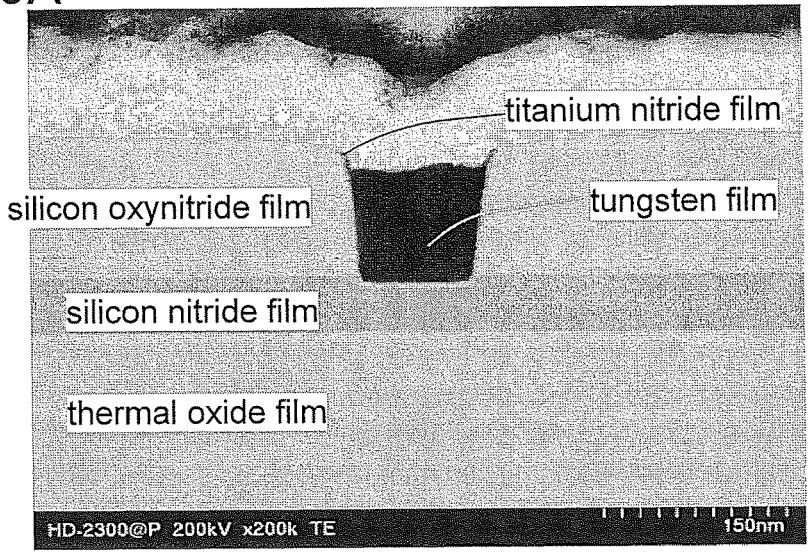
FIGS. 25A to 25C show cross-sectional STEM images in an example.
Figure 25B:
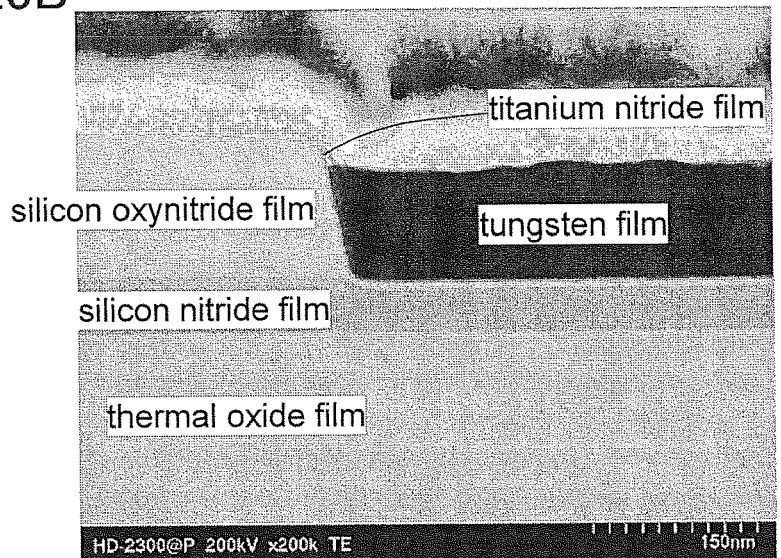
Figure 25C:
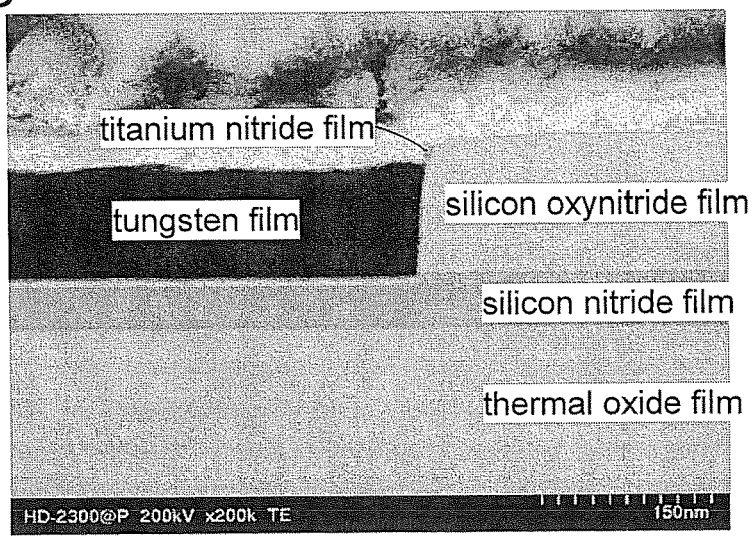

Cross sections of the sample that were taken along two directions perpendicular to each other were observed with the STEM. FIG. 25A and FIGS. 25B and 25C are cross-sectional STEM images in two directions perpendicular to each other.

The observation results reveal that an end of the titanium nitride as a first conductor that is located at an end of the groove was at a level lower than or equal to that of the open side of the groove, and the top surface of the tungsten as a second conductor was at a level lower than or equal to that of the end of the titanium nitride, as in Embodiment 1. In addition, it was found that problems such as oxidation of tungsten and film separation due to the oxidation of tungsten were inhibited.

EXAMPLE 2

In this example, a transistor illustrated in FIGS. 3A to 3C, which includes the wiring layer of Example 1 as a first gate electrode, was fabricated and the transistor characteristics thereof were evaluated.

The channel length L of the transistor was 59 nm and the channel width W was 67 nm. First, the initial characteristics of the transistor were measured.

To evaluate the initial characteristics, a drain current (Id) was measured at room temperature under the conditions that a source was grounded, a drain voltage (Vd) was fixed to 0.1 V, and a second gate voltage (Vg) was varied in 0.1 V steps in the range from −3.0 V to +3.0 V, and the variation curve was recorded. Then, the drain voltage was fixed to 1.8 V, and the variation curves of the drain current was recorded similarly.

Figure 26A:
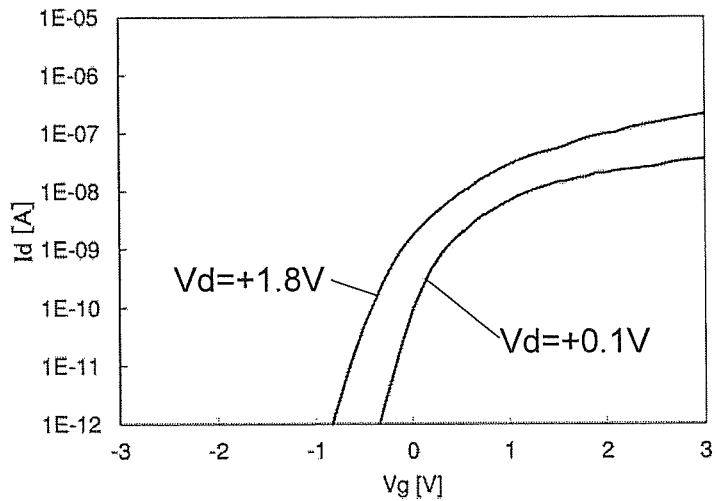
FIGS. 26A to 26C show Id-Vg characteristics in an example.

At that time, the first gate electrode as a back gate was grounded. The results shown in FIG. 26A indicate that excellent on-state characteristics and off-state characteristics of the transistor was able to be achieved.

Figure 26B:
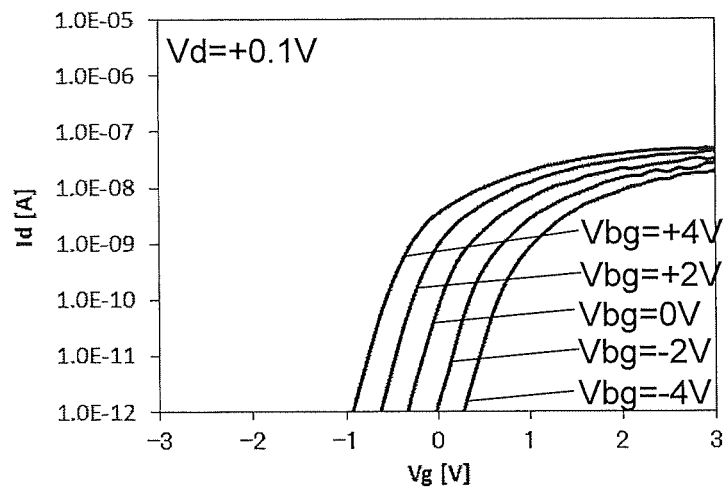
Figure 26C:
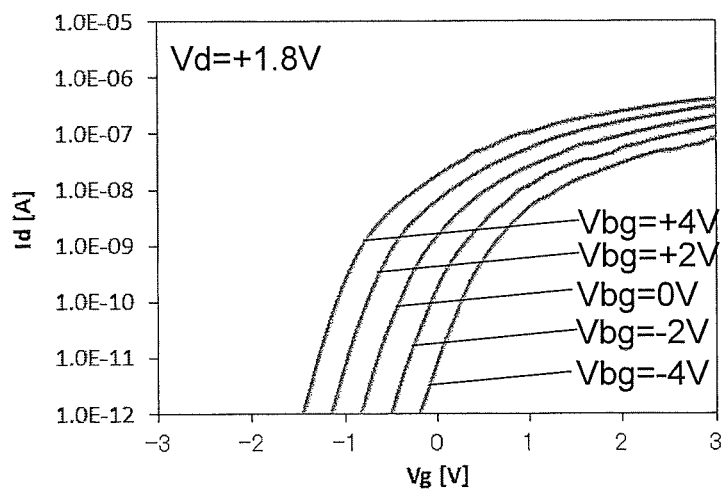

Next, the characteristics of the same transistor were evaluated under the condition that a voltage was applied to the first gate as a back gate. The potential (Vbg) of the first gate as a back gate was varied in 2 V steps to −4 V, −2 V, 0 V, +2 V, and +4 V, the drain current was measured under the same conditions as those for evaluation of the initial characteristics, and the variation curves of the drain current were recorded. FIG. 26B shows the variation curves of the drain current of the case where the potential of the first gate as a back gate was varied to −4 V, −2 V, 0 V, +2 V, and +4 V when the drain voltage was +0.1 V. FIG. 26C shows the variation curves of the drain current of the case where the potential of the first gate as a back gate was varied to −4 V, −2 V, 0 V, +2 V, and +4 V when the drain voltage was +1.8 V.

When the voltage of the first gate as a back gate was varied in the negative direction, the variation curve of the drain current shifted in the positive direction. When the voltage of the first gate was varied in the positive direction, the variation curve of the drain current shifted in the negative direction. These suggest that the first gate electrode served as a back gate and the threshold voltage was able to be controlled normally.

This application is based on Japanese Patent Application serial no. 2014-202820 filed with Japan Patent Office on Oct. 1, 2014, the entire contents of which are hereby incorporated by reference.

What is claimed is:

1. A method for manufacturing a semiconductor device, comprising:
   forming a first insulator;
   forming a second insulator over the first insulator;
   forming an opening in the second insulator;
   forming a first conductor over the second insulator and in the opening;
   forming a second conductor over the first conductor;
   after forming the second conductor, performing a first polishing treatment to remove portions of the first and second conductors above a top surface of the second insulator;
   forming a third conductor over the second conductor and the second insulator; and performing a second polishing treatment on the third conductor until a part of the second insulator is exposed, wherein a part of the first insulator is exposed in the opening, wherein, after the second polishing treatment, a top of a side surface of the first conductor is at a level lower than or equal to a top level of the opening, wherein, after the second polishing treatment, a top surface of the second conductor is at a level lower than or equal to a level of the top of the side surface of the first conductor, wherein the third conductor is in contact with the top surface of the second conductor, wherein the first conductor comprises a metal element and nitrogen, wherein the third conductor comprises a metal element and nitrogen, and wherein the second conductor comprises tungsten.

2. The method for manufacturing a semiconductor device according to claim 1, wherein the first conductor and the third conductor allow less oxygen to pass therethrough than the second conductor.

3. The method for manufacturing a semiconductor device according to claim 1, wherein a bottom surface of the first conductor is in contact with an upper surface of the first insulator in the opening.

4. The method for manufacturing a semiconductor device according to claim 1, wherein an upper surface of the first conductor at a bottom of the opening is above a top surface of the first insulator outside the opening.

5. The method for manufacturing a semiconductor device according to claim 1, wherein the third conductor is in contact with an inside side surface of the first conductor.

6. The method for manufacturing a semiconductor device according to claim 1, wherein a top surface of the third conductor is a concave surface.

7. The method for manufacturing a semiconductor device according to claim 1, further comprising foaming a transistor comprising an oxide semiconductor layer over the third conductor, wherein the oxide semiconductor layer and the third conductor overlap with each other.

8. The method for manufacturing a semiconductor device according to claim 1, further comprising:

forming a third insulator over the third conductor; and forming a fourth conductor over the third insulator;

wherein the fourth conductor, the third insulator, and the third conductor constitutes a capacitor.

9. The method for manufacturing a semiconductor device according to claim 1, wherein the first insulator is formed over a third insulator.

10. A method for manufacturing a semiconductor device, comprising:

forming a first insulator;

forming a second insulator over the first insulator;

forming an opening in the second insulator;

forming a first conductor over the second insulator and in the opening;

forming a second conductor over the first conductor;

after fanning the second conductor, performing a first polishing treatment to remove portions of the first and second conductors above a top surface of the second insulator;

forming a third conductor over the second conductor and the second insulator; and performing a second polishing treatment on the third conductor until a part of the second insulator is exposed, wherein a part of the first insulator is exposed in the opening, wherein, after the second polishing treatment, a top of a side surface of the first conductor is at a level lower than or equal to a top level of the opening, wherein, after the second polishing treatment, a top surface of the second conductor is at a level lower than or equal to a level of the top of the side surface of the first conductor, wherein the third conductor is in contact with the top surface of the second conductor, wherein the first conductor comprises titanium and nitrogen, wherein the third conductor comprises titanium and nitrogen, and wherein the second conductor comprises tungsten.

11. The method for manufacturing a semiconductor device according to claim 10, wherein the first conductor and the third conductor allow less oxygen to pass therethrough than the second conductor.

12. The method for manufacturing a semiconductor device according to claim 10, wherein a bottom surface of the first conductor is in contact with an upper surface of the first insulator in the opening.

13. The method for manufacturing a semiconductor device according to claim 10, wherein an upper surface of the first conductor at a bottom of the opening is above a top surface of the first insulator outside the opening.

14. The method for manufacturing a semiconductor device according to claim 10, wherein the third conductor is in contact with an inside side surface of the first conductor.

15. The method for manufacturing a semiconductor device according to claim 10, wherein a top surface of the third conductor is a concave surface.

16. The method for manufacturing a semiconductor device according to claim 10, further comprising forming a transistor comprising an oxide semiconductor layer over the third conductor, wherein the oxide semiconductor layer and the third conductor overlap with each other.

17. The method for manufacturing a semiconductor device according to claim 10, further comprising:

forming a third insulator over the third conductor; and forming a fourth conductor over the third insulator;

wherein the fourth conductor, the third insulator, and the third conductor constitutes a capacitor.

18. The method for manufacturing a semiconductor device according to claim 10, wherein the first insulator is formed over a third insulator.

19. The method for manufacturing a semiconductor device according to claim 10, wherein the first conductor is a titanium nitride film, wherein the third conductor is a titanium nitride film, and wherein the second insulator comprises silicon and oxygen.

* * * * *